United States Patent
Lee

(10) Patent No.: US 10,125,618 B2
(45) Date of Patent: Nov. 13, 2018

(54) VAPOR DEPOSITION OF RARE EARTH SILICATE ENVIRONMENTAL BARRIER COATINGS

(71) Applicant: Rolls-Royce Corporation, Indianapolis, IN (US)

(72) Inventor: Kang N. Lee, Strongsville, OH (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

(21) Appl. No.: 15/408,062

(22) Filed: Jan. 17, 2017

(65) Prior Publication Data

US 2017/0122116 A1 May 4, 2017

Related U.S. Application Data

(62) Division of application No. 13/818,331, filed as application No. PCT/US2011/048914 on Aug. 24, 2011, now abandoned.

(Continued)

(51) Int. Cl.
*C23C 14/08* (2006.01)
*C23C 14/28* (2006.01)
(Continued)

(52) U.S. Cl.
CPC ............ *F01D 5/288* (2013.01); *C23C 14/08* (2013.01); *C23C 14/30* (2013.01); *C23C 14/548* (2013.01); *F05D 2300/611* (2013.01)

(58) Field of Classification Search
CPC ......... C23C 14/28; C23C 14/30; C23C 14/24; C23C 14/3435; C23C 14/0682; C23C 16/42; C23C 14/08
See application file for complete search history.

(56) References Cited

U.S. PATENT DOCUMENTS 3,590,777 A  7/1971  Elam et al.
3,962,059 A  6/1976  Kaup et al.
(Continued)

FOREIGN PATENT DOCUMENTS

CA  2712248 A1  1/2009
EP  0972853 A1  1/2000
(Continued)

OTHER PUBLICATIONS

Lee, Kang N., et al., "Rare earth silicate environmental barrier coatings for SiC/SiC composites and Si3N4 ceramics". Journal of the European Ceramic Society 25 (2005) 1705-1715.*

(Continued)

*Primary Examiner* — Bret P Chen
(74) *Attorney, Agent, or Firm* — Shumaker & Sieffert, P.A.

(57) ABSTRACT

A vapor deposition method may include applying a first electron beam to vaporize a portion of a first target material comprising a rare earth oxide, where the first electron beam delivers a first amount of energy. The method also may include applying a second electron beam to vaporize a portion of a second target material comprising silica, where the second electron beam delivers a second amount of energy different from the first amount of energy. In some examples, the second target material is separate from the first target material. Additionally, the portion of the first target material and the portion of the second target material may be deposited substantially simultaneously over a substrate to form a layer over the substrate. A system for practicing vapor deposition methods and articles formed using vapor deposition methods are also described.

17 Claims, 8 Drawing Sheets

US 10,125,618 B2
Page 2

Related U.S. Application Data

(60) Provisional application No. 61/377,674, filed on Aug. 27, 2010.

(51) Int. Cl.
*F01D 5/28* (2006.01)
*C23C 14/30* (2006.01)
*C23C 14/54* (2006.01)

(56) References Cited

U.S. PATENT DOCUMENTS

| | | | |
|---|---|---|---|
| 3,964,877 A | 6/1976 | Bessen et al. |
| 4,094,673 A | 6/1978 | Erickson et al. |
| 4,386,968 A | 6/1983 | Hinkel et al. |
| 4,588,607 A | 5/1986 | Matarese et al. |
| 4,663,250 A | 5/1987 | Ong et al. |
| 4,914,794 A | 4/1990 | Strangman |
| 4,996,117 A | 2/1991 | Chu |
| 5,320,909 A | 6/1994 | Scharman et al. |
| 5,350,599 A | 9/1994 | Rigney et al. |
| 5,391,404 A | 2/1995 | Lee et al. |
| 5,496,644 A | 3/1996 | Lee et al. |
| 5,660,885 A | 8/1997 | Hasz et al. |
| 5,714,202 A | 2/1998 | Lemelson et al. |
| 5,704,759 A | 6/1998 | Draskovich et al. |
| 5,773,141 A | 6/1998 | Hasz et al. |
| 5,851,678 A | 12/1998 | Hasz et al. |
| 5,869,146 A | 2/1999 | McCluskey et al. |
| 5,871,820 A | 2/1999 | Hasz et al. |
| 5,876,850 A | 3/1999 | Skowronski et al. |
| 5,876,860 A | 3/1999 | Marijnissen et al. |
| 5,914,189 A | 6/1999 | Hasz et al. |
| 5,985,470 A | 11/1999 | Spitsberg et al. |
| 6,057,047 A | 5/2000 | Maloney |
| 6,261,643 B1 | 7/2001 | Hasz et al. |
| 6,284,325 B1 | 9/2001 | Eaton, Jr. et al. |
| 6,296,942 B1 | 10/2001 | Eaton et al. |
| 6,299,988 B1 | 10/2001 | Wang et al. |
| 6,312,763 B1 | 11/2001 | Eaton, Jr. et al. |
| 6,410,148 B1 | 6/2002 | Eaton, Jr. et al. |
| 6,465,090 B1 | 10/2002 | Stowell et al. |
| 6,468,648 B1 | 10/2002 | McCluskey et al. |
| 6,485,848 B1 | 11/2002 | Wang et al. |
| 6,562,409 B2 | 5/2003 | Koshkarian et al. |
| 6,613,445 B2 | 9/2003 | Sangeeta et al. |
| 6,617,036 B2 | 9/2003 | Eaton et al. |
| 6,627,323 B2 | 9/2003 | Nagaraj et al. |
| 6,720,038 B2 | 4/2004 | Darolia et al. |
| 6,723,674 B2 | 4/2004 | Wang et al. |
| 6,733,908 B1 | 5/2004 | Lee et al. |
| 6,759,151 B1 | 7/2004 | Lee |
| 6,787,195 B2 | 9/2004 | Wang et al. |
| 6,812,176 B1 | 11/2004 | Zhu et al. |
| 6,835,465 B2 | 12/2004 | Allen et al. |
| 6,869,508 B2 | 3/2005 | Darolia et al. |
| 6,887,528 B2 | 5/2005 | Lau et al. |
| 6,887,595 B1 | 5/2005 | Darolia et al. |
| 6,890,668 B2 | 5/2005 | Bruce et al. |
| 6,893,750 B2 | 5/2005 | Nagaraj et al. |
| 6,902,662 B2 | 6/2005 | Eaton et al. |
| 6,902,836 B2 | 6/2005 | Eaton et al. |
| 6,933,061 B2 | 8/2005 | Nagaraj et al. |
| 6,933,066 B2 | 8/2005 | Nagaraj et al. |
| 6,969,555 B2 | 11/2005 | Meschter et al. |
| 7,008,674 B2 | 3/2006 | Nagaraj et al. |
| 7,063,894 B2 | 6/2006 | Sun et al. |
| 7,090,894 B2 | 8/2006 | Carper et al. |
| 7,186,466 B2 | 3/2007 | Zhu et al. |
| 7,226,668 B2 | 6/2007 | Nagaraj et al. |
| 7,354,651 B2 | 4/2008 | Hazel et al. |
| 7,374,818 B2 | 5/2008 | Bhatia et al. |
| 7,374,825 B2 | 5/2008 | Hazel et al. |
| 7,442,444 B2 | 10/2008 | Hazel et al. |
| 7,449,254 B2 | 11/2008 | Spitsberg et al. |
| 7,544,394 B2 | 6/2009 | Boutwell et al. |
| 7,579,085 B2 | 8/2009 | Hazel |
| 7,595,114 B2 | 9/2009 | Meschter et al. |
| 7,666,512 B2 | 2/2010 | Bhatia et al. |
| 7,695,830 B2 | 4/2010 | Strangman et al. |
| 7,740,960 B1 | 6/2010 | Zhu et al. |
| 7,867,575 B2 | 1/2011 | Boutwell et al. |
| 7,879,411 B2 | 2/2011 | Hass et al. |
| 7,951,459 B2 | 5/2011 | Tang et al. |
| 7,968,217 B2 | 6/2011 | Sarrafi-Nour et al. |
| 8,084,086 B2 | 12/2011 | Hass et al. |
| 8,119,247 B2 | 2/2012 | Kirby et al. |
| 8,124,252 B2 | 2/2012 | Cybulsky et al. |
| 8,470,460 B2 | 6/2013 | Lee |
| 2001/0033630 A1 | 10/2001 | Hassoun et al. |
| 2002/0098391 A1 | 7/2002 | Tanaka et al. |
| 2003/0113553 A1 | 6/2003 | Sun et al. |
| 2003/0113559 A1 | 6/2003 | Eaton et al. |
| 2003/0118841 A1 | 6/2003 | Home et al. |
| 2003/0138658 A1 | 7/2003 | Taylor et al. |
| 2003/0152797 A1* | 8/2003 | Darolia ............... C23C 14/08 428/633 |
| 2004/0018303 A1* | 1/2004 | Bruce ............... C23C 14/246 427/248.1 |
| 2004/0038085 A1 | 2/2004 | Litton et al. |
| 2004/0043150 A1 | 3/2004 | Movchan et al. |
| 2004/0043244 A1 | 3/2004 | Bruce et al. |
| 2004/0115351 A1 | 6/2004 | Lau et al. |
| 2004/0151840 A1 | 8/2004 | Wang et al. |
| 2004/0170849 A1 | 9/2004 | Ackerman et al. |
| 2005/0000444 A1* | 1/2005 | Hass ............... C23C 14/0021 118/723 EB |
| 2005/0003172 A1 | 1/2005 | Wheeler et al. |
| 2005/0003175 A1 | 1/2005 | Wheeler et al. |
| 2005/0126494 A1 | 6/2005 | Darolia et al. |
| 2005/0129511 A1 | 6/2005 | Allen |
| 2005/0129973 A1 | 6/2005 | Eaton et al. |
| 2005/0164027 A1 | 7/2005 | Lau et al. |
| 2005/0202168 A1* | 9/2005 | Movchan ............... C23C 14/083 427/248.1 |
| 2005/0255648 A1 | 11/2005 | Bhatia et al. |
| 2006/0014029 A1 | 1/2006 | Saak et al. |
| 2006/0024513 A1 | 2/2006 | Schlichting et al. |
| 2006/0024527 A1 | 2/2006 | Schlichting et al. |
| 2006/0024528 A1 | 2/2006 | Strangman et al. |
| 2006/0029733 A1 | 2/2006 | Bhatia et al. |
| 2006/0046450 A1 | 3/2006 | Narendar et al. |
| 2006/0073361 A1 | 4/2006 | Fukudome et al. |
| 2006/0078750 A1 | 4/2006 | Zhu et al. |
| 2006/0115659 A1 | 6/2006 | Hazel et al. |
| 2006/0115661 A1 | 6/2006 | Hazel et al. |
| 2006/0154093 A1 | 7/2006 | Meschter et al. |
| 2006/0166018 A1 | 7/2006 | Spitsberg et al. |
| 2006/0210800 A1 | 9/2006 | Spitsberg et al. |
| 2006/0211241 A1 | 9/2006 | Govern et al. |
| 2006/0280952 A1 | 12/2006 | Hazel et al. |
| 2006/0280953 A1 | 12/2006 | Hazel et al. |
| 2006/0280954 A1 | 12/2006 | Spitsberg et al. |
| 2006/0280955 A1 | 12/2006 | Spitsberg et al. |
| 2006/0280963 A1 | 12/2006 | Hazel et al. |
| 2007/0014996 A1 | 1/2007 | Bhatia et al. |
| 2007/0071996 A1 | 3/2007 | Hazel et al. |
| 2007/0082131 A1 | 4/2007 | Doesberg et al. |
| 2007/0119713 A1 | 5/2007 | Hasz |
| 2007/0141367 A1 | 6/2007 | Darolia et al. |
| 2007/0160859 A1 | 7/2007 | Darolia et al. |
| 2007/0184204 A1 | 8/2007 | Balagopal et al. |
| 2007/0207330 A1 | 9/2007 | Tulyani et al. |
| 2007/0224411 A1 | 9/2007 | Hazel et al. |
| 2008/0124479 A1 | 5/2008 | Hazel et al. |
| 2008/0145674 A1 | 6/2008 | Darolia et al. |
| 2008/0182034 A1 | 7/2008 | Kurauchi et al. |
| 2008/0206542 A1 | 8/2008 | Vance et al. |
| 2008/0220177 A1* | 9/2008 | Hass ............... C23C 14/0021 427/446 |
| 2008/0274336 A1 | 11/2008 | Merrill et al. |
| 2009/0102008 A1 | 4/2009 | Kakehata |
| 2009/0155554 A1 | 6/2009 | Gentleman et al. |
| 2009/0162539 A1 | 6/2009 | Boutwell |
| 2009/0162556 A1 | 6/2009 | Boutwell et al. |

(56) References Cited

U.S. PATENT DOCUMENTS

| | | |
|---|---|---|
| 2009/0162684 A1 | 6/2009 | Creech |
| 2009/0169914 A1 | 7/2009 | Fu et al. |
| 2009/0176059 A1 | 7/2009 | Namba et al. |
| 2009/0178413 A1 | 7/2009 | Lee |
| 2009/0184280 A1 | 7/2009 | Lee |
| 2009/0186237 A1* | 7/2009 | Lee ............... C04B 41/009 428/640 |
| 2009/0324930 A1 | 12/2009 | Tulyani et al. |
| 2010/0047474 A1* | 2/2010 | Neal ............... C23C 14/228 427/585 |
| 2010/0080984 A1 | 4/2010 | Lee |
| 2010/0129636 A1 | 5/2010 | Cybulsky et al. |
| 2010/0136349 A1 | 6/2010 | Lee |
| 2010/0159150 A1 | 6/2010 | Kirby et al. |
| 2010/0159253 A1 | 6/2010 | Kirby et al. |
| 2011/0027467 A1 | 2/2011 | Kirby et al. |
| 2011/0027469 A1 | 2/2011 | Kirby et al. |
| 2011/0027470 A1 | 2/2011 | Kirby et al. |
| 2011/0027476 A1 | 2/2011 | Kirby et al. |
| 2011/0027484 A1 | 2/2011 | Kirby et al. |
| 2011/0027517 A1 | 2/2011 | Kirby et al. |
| 2011/0027557 A1 | 2/2011 | Kirby et al. |
| 2011/0027558 A1 | 2/2011 | Kirby et al. |
| 2011/0027559 A1 | 2/2011 | Kirby et al. |
| 2011/0027578 A1 | 2/2011 | Kirby et al. |
| 2011/0033630 A1 | 2/2011 | Naik et al. |
| 2011/0111310 A1 | 5/2011 | Pastula et al. |
| 2011/0256411 A1 | 10/2011 | Courcot et al. |
| 2012/0076943 A1 | 3/2012 | Kirby et al. |
| 2012/0077004 A1 | 3/2012 | Kirby et al. |
| 2012/0128879 A1 | 5/2012 | Cybulsky et al. |
| 2012/0244383 A1 | 9/2012 | Meschter et al. |
| 2013/0011578 A1 | 1/2013 | Hass et al. |
| 2013/0129938 A1 | 5/2013 | Hass |
| 2013/0136915 A1 | 5/2013 | Naik |
| 2013/0189531 A1 | 7/2013 | Lee |
| 2013/0224457 A1 | 8/2013 | Lee |
| 2014/0065438 A1 | 3/2014 | Lee |
| 2014/0261080 A1 | 9/2014 | Lee |
| 2014/0272197 A1 | 9/2014 | Lee |

FOREIGN PATENT DOCUMENTS

| | | |
|---|---|---|
| EP | 1335040 A2 | 8/2003 |
| EP | 1400611 A1 | 8/2003 |
| EP | 1479661 A1 | 5/2004 |
| EP | 1479661 A2 | 11/2004 |
| EP | 1666638 A1 | 9/2005 |
| EP | 1975258 A1 | 12/2006 |
| EP | 1806435 A2 | 1/2007 |
| EP | 1795515 A2 | 6/2007 |
| EP | 1829847 A2 | 9/2007 |
| EP | 2108715 A2 | 10/2009 |
| EP | 2208805 A1 | 12/2009 |
| EP | 2189504 A1 | 5/2010 |
| EP | 2192098 A2 | 6/2010 |
| EP | 2194164 A1 | 6/2010 |
| EP | 2287131 A2 | 7/2010 |
| EP | 2287138 A2 | 8/2010 |
| EP | 2245096 A2 | 11/2010 |
| EP | 2468918 A2 | 6/2012 |
| GB | 2319248 A | 5/1998 |
| JP | 2004-263068 * | 9/2004 |
| SG | 163216 | 3/2013 |
| WO | 2012012431 A1 | 7/2001 |
| WO | 2006023894 A2 | 3/2006 |
| WO | 2007098152 A2 | 8/2007 |
| WO | 2007116547 A2 | 10/2007 |
| WO | 2008103163 A2 | 8/2008 |
| WO | 2008109214 A2 | 9/2008 |
| WO | 2009091721 A2 | 7/2009 |
| WO | 2009091724 A1 | 7/2009 |
| WO | 2010039699 A3 | 4/2010 |
| WO | 2011085109 A1 | 7/2011 |
| WO | 2011085376 A1 | 7/2011 |
| WO | 2011123432 A1 | 10/2011 |
| WO | 2012027442 A1 | 3/2012 |
| WO | 2012129431 A1 | 9/2012 |

OTHER PUBLICATIONS

Xu, Yue, et al., "Rare earch silicate environmental barrier coatings: Present status and prospective". Ceramics International, 43 (2017) 5847-5855.*

Vassen, Robert, et al., "Zirconates as New Materials for Thermal Barrier Coatings". J. Am. Ceram. Soc., 83 [8] 2023-2028 (2000).*

Maier, N., et al., "High temperature water vapour corrosion of rare earth disilicates (Y,Yb, Lu)2Si2O7 in the presence of Al(OH)3 impurities". Journal of the European Ceramic Society 27 (2007) 2705-2713.*

Anderson et al., "Ultrasonic Measurement of the Kearns Texture Factors in Zircaloy, Zirconium, and Titanium," Metallurgical and Materials Transactions, vol. 30A, Aug. 1999, 8 pp.

Directed Vapor Technologies International, Inc., "Coating Technology for the Future", downloaded on Dec. 9, 2013 at http://www.directedvapor.com/Capabilities_Brochure.pdf, 7 pp.

Grant et al., "CMAS degradation of environmental barrier coatings," Surface and Coatings Technology, vol. 202, Jul. 4, 2007, 5 pp.

Harder et al., "Chemical and Mechanical Consequences of Environmental Barrier Coating Exposure to Calcium—Magnesium—Aluminosilicate," Journal of the American Ceramic Society, vol. 94, No. S1, Mar. 17, 2011, 8 pp.

Intrnational Preliminary Report on Patentability from corresponding international application No. PCT/US2011/048914, dated Mar. 14, 2013,9 pp.

International Search Report and Written Opinion of corresponding international application No. PCT/US2011/048914, dated Nov. 30, 2011, 14 pp.

Kramer et al., "Thermochemical Interaction of Thermal Barrier Coatings with Molten CaO—MgO—Al2O3—SiO2 (CMAS) Deposits," Journal of the American Ceramic Society, vol. 89, No. 10, Aug. 9, 2006, 9 pp.

Lee et al., "Rare earth silicate environmental barrier coatings for SiC/SiC composites and Si3N4 ceramics," Journal of the European Ceramic Society (Jan. 25, 2005): 1705-1715.

Shelby et al., "Rare earth aluminosilicate glasses," Journal of American Ceramic Society, vol. 73, No. 1,1990, 4 pp. (Applicant points out, in accordance with MPEP 609.04(a), that the year of publication, 1990, is sufficiently earlier than the effective U.S. filing date, Jan. 17, 2017, so that the particular month of publication is not in issue.).

Prosecution History from U.S. Appl. No. 13/818,331, dated Feb. 22, 2013 through Nov. 14, 2016, 70 pp.

Prosecution History from U.S. Appl. No. 14/208,205, dated Nov. 24, 2015 through Feb. 7, 2017, 91 pp.

* cited by examiner

VAPOR DEPOSITION OF RARE EARTH SILICATE ENVIRONMENTAL BARRIER COATINGS

This application is divisional of U.S. patent application Ser. No. 13/818,331, filed Jun. 4, 2013, now abandoned, which is a national stage entry under 35 U.S.C. § 371 of PCT Application No. PCT/US11/48914, filed Aug. 24, 2011, which claims the benefit of U.S. Provisional Patent Application No. 61/377,674, filed Aug. 27, 2010. The entire contents of U.S. patent application Ser. No. 13/818,331; International Patent Application No. PCT/US11/48914/ and U.S. Provisional Patent Application No. 61/377,674 are incorporated herein by reference.

TECHNICAL FIELD

This disclosure relates to environmental barrier coatings and, more particularly, to rare earth silicate environmental barrier coatings.

BACKGROUND

Components of high-temperature mechanical systems, such as, for example, gas-turbine engines, must operate in severe environments. For example, the high-pressure turbine blades and vanes exposed to hot gases in commercial aeronautical engines typically experience metal surface temperatures of about 1000° C., with short-term peaks as high as 1100° C.

Some components of high-temperature mechanical systems include a Ni or Co-based superalloy substrate. In an attempt to reduce the temperatures experienced by the substrate, the substrate can be coated with a thermal barrier coating (TBC). The TBC may include a thermally insulative ceramic topcoat and is bonded to the substrate by an underlying metallic bond coat. The TBC, usually applied either by air plasma spraying or electron beam physical vapor deposition, is most often a layer of yttria-stabilized zirconia (YSZ) with a thickness of about 100 micrometers (μm) to about 500 μm. The properties of YSZ include low thermal conductivity, high oxygen permeability, and a relatively high coefficient of thermal expansion. The YSZ TBC is also typically made "strain tolerant" and the thermal conductivity further lowered by depositing a structure that contains numerous pores and/or pathways.

Economic and environmental concerns, i.e., the desire for improved efficiency and reduced emissions, continue to drive the development of advanced gas turbine engines with higher inlet temperatures. Some components of high-temperature mechanical systems include a ceramic or ceramic matrix composite (CMC) substrate, which may allow an increased operating temperature compared to a component with a superalloy substrate. The ceramic or CMC substrate can be coated with an environmental barrier coating (EBC) to reduce exposure of a surface of the substrate to environmental species, such as water vapor or oxygen. In some embodiments, the EBC also may provide some thermal insulation to the ceramic or CMC substrate. The EBC may include a ceramic topcoat, and may be bonded to the substrate by an underlying metallic or ceramic bond coat.

SUMMARY

In general, the disclosure is directed to rare earth silicate environmental barrier coatings and vapor deposition techniques used to create environmental barrier coatings. In some embodiments, the vapor deposition techniques include depositing a rare earth oxide from a first target material and substantially simultaneously depositing silica from a second target material.

It has been found that depositing an EBC using vapor deposition, such as EB-PVD, from at least two sources may mitigate the difficulty of controlling the composition of an EBC including at least two components. For example, an EBC including at least two components may be deposited from at least two material sources. In some embodiments, the amount of energy provided to each of the material sources may be controlled independently to result in a desired composition of the EBC. For example, an electron beam of a substantially constant power may be directed at each of the material sources for different relative residence times to control the relative amount of energy directed at the respective material sources. As another example, a power level of an electron beam may be changed when the electron beam is directed at different material sources. As an additional example, at least two electron beams may be utilized, each beam being directed to a respective material target. In some embodiments, the power of at least one of the electron beams is different than a power of at least one other of the electron beams.

In one aspect, the disclosure is directed to a vapor deposition method that includes applying a first electron beam to vaporize a portion of a first target material comprising a rare earth oxide, wherein the first electron beam delivers a first amount of energy, and applying a second electron beam to vaporize a portion of a second target material comprising silica, wherein the second electron beam delivers a second amount of energy different from the first amount of energy. According to this aspect of the disclosure, the second target material is separate from the first target material. Additionally, according to this method, the portion of the first target material and the portion of the second target material are deposited substantially simultaneously over a substrate to form a layer over the substrate.

In another aspect, the disclosure is directed to a system including a vacuum chamber and a first electron beam source configured to deliver a first electron beam to vaporize a portion of a first target material comprising a rare earth oxide, wherein the first electron beam delivers a first amount of energy. According to this aspect of the disclosure, the system also includes a second electron beam source configured to deliver a second electron beam to vaporize a portion of a second target material comprising silica. The second electron beam delivers a second amount of energy different than the first amount of energy. The system further includes a substrate. The system is configured to substantially simultaneously deposit the portion of the first target material and the portion of the second target material in a layer over the substrate. In addition, the system is configured to deliver the first amount of energy so the first amount of energy is between approximately 1.1 and approximately 2 times greater than the second amount of energy.

In another aspect, the disclosure is directed to an article that includes a substrate and an environmental barrier coating formed over the substrate. According to this aspect of the disclosure, the environmental barrier coating includes a first material having a first vapor pressure and a second material having a second vapor pressure different from the first vapor pressure. The first material is deposited from a first target material that includes a rare earth oxide by applying a first electron beam to vaporize a portion of the first target material, the first electron beam delivering a first amount of energy. The second material is deposited from a second target material that comprises silica by applying a second electron beam to vaporize a portion of the second target material, the second electron beam delivering a second amount of energy. In addition, the first amount of energy is between approximately 1.33 and approximately 1.47 times greater than the second amount of energy.

The details of one or more embodiments of this disclosure are set forth in the accompanying drawings and the description below. Other features, objects, and advantages of this disclosure will be apparent from the description and drawings, and from the claims.

DETAILED DESCRIPTION

Figure 1A:
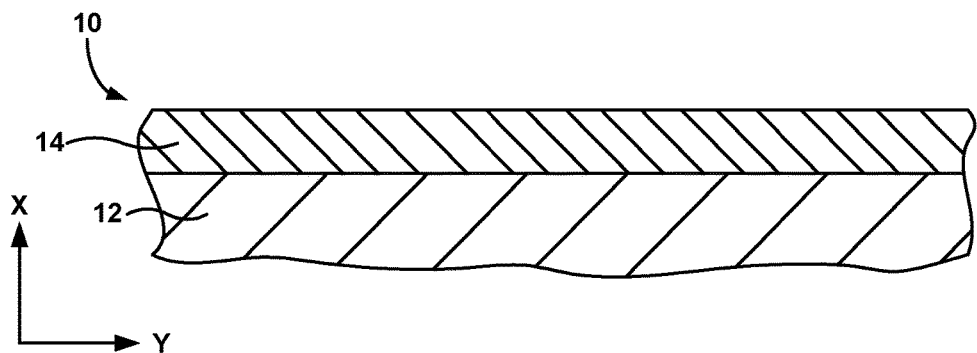
FIGS. 1A and 1B are cross-sectional schematic diagrams of an example of a substrate coated with an environmental barrier coating.

In general, the disclosure relates to rare earth silicate environmental barrier coatings (EBCs) and vapor deposition techniques used to create rare earth silicate EBCs. The vapor deposition techniques may remove a portion of material from at least one target material and deposit the removed target material onto a surface of a component to form an EBC. In subsequent use, the EBC may protect the component from operating conditions that may otherwise degrade the component.

Some EBCs have been deposited on a substrate via plasma spraying. Although plasma spraying may produce an EBC with acceptable properties for some applications, in other applications, a plasma spray-deposited EBC may be disadvantageous. For example, an EBC deposited by plasma spraying may have a surface roughness which is disadvantageous in applications where low surface roughness improves aerodynamic performance, such as, for example, on a gas turbine engine blade. Additionally, an EBC deposited by plasma spraying may have erosion and/or sinter resistance that is less than desired for some applications.

According to one aspect of the disclosure, an EBC may be deposited on a substrate via a vapor deposition technique, such as, for example, electron beam physical vapor deposition (EB-PVD) or directed vapor deposition (DVD). In some embodiments, the EBC may include more than one component. For example, an EBC may include a rare earth silicate, which is formed from a rare earth oxide and silica.

In some instances, the at least two components may have different physical or chemical properties which make controlled, simultaneous deposition difficult. For example, silica and a rare earth oxide may have different heats of vaporization and/or vapor pressures at a given temperature and pressure. Accordingly, a rare earth oxide and silica may have different vaporization rates when exposed to similar amounts of energy. Thus, when deposition of silica and a rare earth oxide using EB-PVD from a single material source is attempted, the resulting coating may have a different composition than the material source composition.

However, it has been found that depositing an EBC using vapor deposition, such as EB-PVD, from at least two sources may mitigate the difficulty of controlling composition of an EBC including at least two components. For example, an EBC including at least two components may be deposited from at least two material sources. In some embodiments, the amount of energy provided to each of the material sources may be controlled independently to result in a desired composition of the EBC. For example, an electron beam of a substantially constant power may be directed at each of the material sources for different relative residence times to control the relative amount of energy directed at the respective material sources. As another example, a power level of an electron beam may be changed when the electron beam is directed at different material sources. As an additional example, at least two electron beams may be utilized, each beam being directed to a respective material target. In some embodiments, the power of at least one of the electron beams is different than a power of at least one other of the electron beams.

Figure 1B:
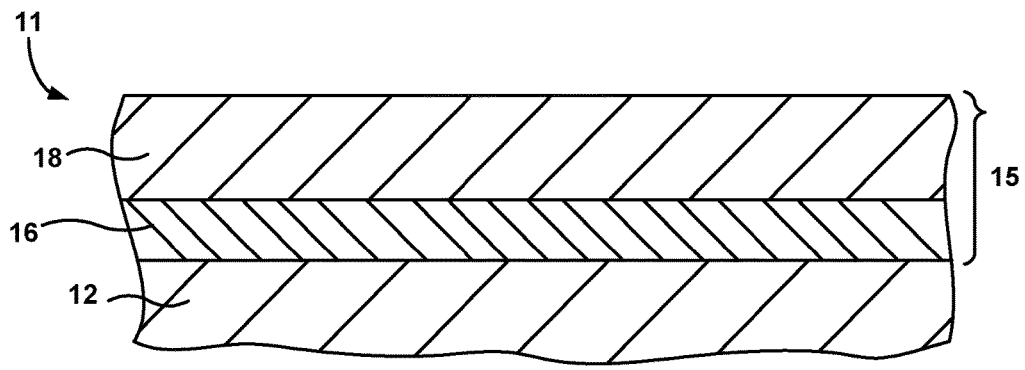

FIGS. 1A and 1B are cross-sectional schematic diagrams of an example article 10 that may be used in a high-temperature mechanical system. Article 10 includes EBC 14 formed over substrate 12. EBC 14 may be a single EBC layer or may include multiple EBC layers. For example, article 10 in FIG. 1A includes an EBC 14 formed of a single layer, while article 11 in FIG. 1B includes an EBC 15 formed of a first EBC layer 16 and a second EBC layer 18. The selection and formation of one or more EBC layers 16, 18 may depend on a variety of factors, as described in greater detail below.

Substrate 12 may be a component configured for use in a high temperature mechanical system. For example, the high temperature mechanical system may be a turbine engine and substrate 12 may be a turbine blade, turbine vane, turbine blade track, turbine combustion liner, or the like. Because substrate 12 may be configured for used in a high temperature mechanical system, substrate 12 may be formed from any material or combination of materials suitable for use in a high temperature mechanical system. Materials suitable for use in a high temperature mechanical system may include a superalloy, a metal-silicon alloy, a ceramic, including a ceramic matrix composite (CMC), or other similar materials capable operating at high temperatures. In some embodiments, substrate 12 may include a Ni- or Co-based superalloy.

In some embodiments, substrate 12 may be a metal-silicon alloy, such as a molybdenum-silicon alloy (e.g., $MoSi_2$), niobium-silicon alloy (e.g., $NbSi_2$), or the like. When substrate 12 is a metal-silicon alloy, the metal-silicon alloy may include additional elements to alter the mechanical performance of the alloy. Elements that affect properties such as toughness, hardness, temperature stability, corrosion resistance, and oxidation resistance are known in the art and may be used in substrate 12.

As noted, substrate 12 may also be a ceramic. For example, a suitable ceramic for substrate 12 may be a ceramic that includes silicon, such as a silicon carbide (SiC), silicon nitride ($Si_3N_4$), or similar silicon-containing ceramic.

In further examples, substrate 12 may include a ceramic matrix composite (CMC). The CMC may include a matrix material such as silicon carbide, silicon nitride, alumina, silica, or the like. The CMC may also include a filler material, and the filler material may provide continuous reinforcement or a discontinuous reinforcement. For example, the filler material may include discontinuous whiskers, platelets, or particulates. As another example, the filler material may include a continuous monofilament or multifilament weave.

The filler composition, shape, size, and the like may be selected to provide desired properties to the CMC. For example, the filler material may be chosen to increase the toughness of a brittle ceramic matrix. Other CMC properties can also be tailored with the addition of a filler material. For instance, a filler material may affect thermal conductivity, electrical conductivity, thermal expansion, hardness, or other desired properties of the CMC.

In some embodiments, the filler composition is the same as a ceramic matrix material. For example, a silicon carbide matrix may surround silicon carbide whiskers. In other cases, the filler material may include a different composition than the ceramic matrix, such as mullite fibers in an alumina matrix. As a particular example, a CMC may include silicon carbide continuous fibers embedded in a silicon carbide matrix.

In accordance with the disclosure, EBC 14 is formed over at least a portion of substrate 12, as illustrated in FIG. 1A. EBC may function to protect substrate 12 from environmental attack and, in some embodiments, thermal effects. As a result, EBC may include materials that are resistant to environmental degradation, such as oxidation and water vapor attack. Exemplary EBC materials include components such as alumina, zirconia, hafnia, rare earth oxide-stabilized zirconia, rare earth oxide-stabilized hafnia, a rare earth silicate, a glass ceramic, mullite, and combinations thereof. In some examples, a glass ceramic may include a barium strontium alumina silicate ($BaO_x$—$SrO_{1-x}$—$Al_2O_3$-$2SiO_2$), a barium alumina silicate ($BaO$—$Al_2O_3$-$2SiO_2$), a strontium alumina silicate ($SrO$—$Al_2O_3$-$2SiO_2$), a calcium alumina silicate ($CaO$—$Al_2O_3$-$2SiO_2$), a magnesium alumina silicate ($2MgO$-$2Al_2O_3$-$5SiO_2$), or a lithium alumina silicate ($Li_2O$—$Al_2O_3$-$2SiO_2$).

In some embodiments, EBC 14 may include a rare earth silicate. An EBC including a rare earth silicate may exhibit good chemical compatibility with an underlying substrate, such as a substrate that contains silicon. An EBC 14 including a rare earth silicate may also maintain its structure at high temperatures, thus enabling use of the component including an EBC 14 comprising a rare earth silicate at relatively high temperatures. In addition, an EBC 14 including a rare earth silicate may exhibit low volatility (e.g., low reactivity and volatilization) under high temperature and high pressure conditions.

Suitable rare earth silicates for use in EBC 14 may include a rare earth monosilicate, represented as $RE_2SiO_5$ or $RE_2O_3$—$SiO_2$, where RE is a rare earth element; a rare earth disilicate, represented as $RE_2Si_2O_7$ or $RE_{23}$-$2SiO_2$, where RE is a rare earth element, or combinations thereof In some examples, EBC 14 may include only a single rare earth silicate, while in other examples, EBC 14 may include multiple rare earth silicates. EBC 14 may include, for example, a silicate of at least one of Lanthanum (La), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Lutetium (Lu), Yttrium (Y), or Scandium (Sc). In addition to a rare earth silicate material, EBC 14 may include silica (e.g., $SiO_2$) and/or rare earth oxide (e.g., $RE_2O_3$) that includes of one or more rare earth elements.

In accordance with one aspect of the disclosure, the rare earth silicate may be deposited on substrate 12 as a rare earth oxide and silica. At least some of the rare earth oxide and silica may then react or combine to form a rare earth disilicate or rare earth monosilicate. Accordingly, in some embodiments, and EBC 14 which includes a rare earth silicate may include a rare earth oxide, silica, a rare earth monosilicate, and/or a rare earth disilicate.

In some embodiments, EBC 14 may include greater than or equal to approximately 50 volume percent rare earth silicate, such as greater than or equal to approximately 75 volume percent rare earth silicate, or greater than or equal to approximately 90 volume percent rare earth silicate. For example, EBC 14 may include greater than or equal to approximately 50 volume percent rare earth silicate while the remaining portion of EBC 14 may include free (i.e., unreacted) rare earth oxide and/or free silica.

As will be described in greater detail below, EBC 14 can be formed with different microstructures. The different microstructures of EBC 14 may affect the subsequent performance of the EBC 14. For example, EBC 14 may be formed with a dense microstructure that is substantially nonporous. A substantially nonporous microstructure may prevent environmental species such as water vapor, oxygen, molten salt, or calcia-magnesia-alumina-silicate (CMAS) deposits from contacting substrate 12 and degrading the material structure of substrate 12. For example, water vapor may react with a substrate 12 including a CMC and volatilize silica or alumina components in substrate 12. Consequently, an EBC 14 which is substantially nonporous may provide protection to substrate 12 by preventing water vapor from contacting and reacting with substrate 12. In some examples, an EBC 14 with a dense microstructure may have a porosity of less than about 10 vol. %, such as, e.g., less than about 5 vol. %, where porosity is measured as a percentage of pore volume divided by total volume of EBC 14.

In some embodiments, EBC 14 may alternatively have a columnar microstructure. A columnar microstructure may have microcracks or microgaps that extend through at least a portion of EBC 14 in a direction that is substantially orthogonal to the plane defined by the EBC coating surface (i.e., in the x-direction indicated in FIG. 1A). Because of the microgaps, a columnar microstructure may have enhanced mechanical compliance under thermal cycling or when a temperature gradient exists, such as when a high-temperature system is first engaged. Additionally, an EBC 14 having a columnar microstructure may provide improved thermal protection to substrate 12 compared to an EBC 14 that is substantially nonporous. While not wishing to be bound by theory, the microcracks or microgaps may provide scattering sites for thermal energy-carrying phonons, which may lower an effective thermal conductivity of an EBC 14 having a columnar microstructure compared to a substantially nonporous EBC 14 of a similar composition.

In some embodiments, thermal protection and mechanical compliance are not the only benefits of a columnar microstructure EBC. An EBC 14 having a columnar microstructure may also exhibit enhanced erosion resistance and enhanced sintering resistance relative to an EBC 14 which includes a substantially nonporous microstructure.

In some examples, as illustrated in FIG. 1B, an article 11 may include an EBC 15 having a first EBC layer 16 and a second EBC layer 18. In some embodiments, first EBC layer 16 and second EBC layer 18 may have different microstructures and/or different compositions, while in other embodiments, first EBC layer 16 and second EBC layer 18 may have similar microstructures and/or similar compositions. For example, first EBC layer 16 may include a columnar microstructure and second EBC layer 18 may include a substantially dense microstructure. Conversely, first EBC layer 16 may include a substantially dense microstructure and second EBC layer 18 may include a columnar microstructure.

With respect to the composition of first and second EBC layers 16, 18, in some embodiments, the first and second EBC layers 16, 18 may include the same components in similar proportions. In other embodiments, first and second EBC layers 16, 18 may include the same components in different proportions. For example, EBC layer 16 may include a rare earth disilicate while EBC layer 18 may include a rare earth monosilicate. The interface between EBC layer 16 and EBC layer 18 may be discrete, where there is a sharp compositional transition between EBC layer 16 and EBC layer 18. Alternatively, the interface between EBC layer 16 and EBC layer 18 may be compositionally graded, where the interface transitions from being compositionally similar to EBC layer 16 adjacent EBC layer 16 to being compositionally similar to EBC layer 18 adjacent to EBC 18. In still other embodiments, first and second EBC layers 16, 18 may include the different components (e.g., different rare earth oxides) in similar or different proportions.

In some embodiments, the technique according to which EBC 14 or 15 (collectively "EBC 14") is formed may affect performance of the EBC 14. For example, when a composition of EBC 14 deviates from an intended chemical composition, environmental and thermal forces may degrade the EBC 14 more quickly than predicted based on the intended composition. In some cases, the failure of EBC 14 may lead to the failure of the component coated with EBC 14 due to damage of substrate 12.

EBC 14 may be applied using various techniques. For example, some techniques include plasma spraying, electron beam physical vapor deposition (EB-PVD), and chemical vapor deposition (CVD). Certain techniques may be disadvantageous in certain embodiments. For example, EB-PVD generally operates by applying an energy source to a single ingot of target material. The target material vaporizes and migrates to a substrate, resulting in a deposited EBC 14. In some examples, the various components that comprise the target material may have different physical properties, such as different heats of vaporization or different vapor pressures. As a result, EBC 14 formed from the single target material may have a different chemical composition, such as a different ratio of components, than the target material.

By contrast, this disclosure provides vapor deposition systems and techniques that use multiple target materials, such as at least two target materials, to form EBC 14. Each target material can include at least one chemical component, and the vaporization rates of the different target materials can be independently controlled. As a result, vaporization of the different target materials can be controlled to create EBC 14 with a desired chemical composition. For instance, the ratio of energy delivered to a first target material and a second target material can be adjusted to achieve EBC 14 with a desired chemical composition.

Figure 2:
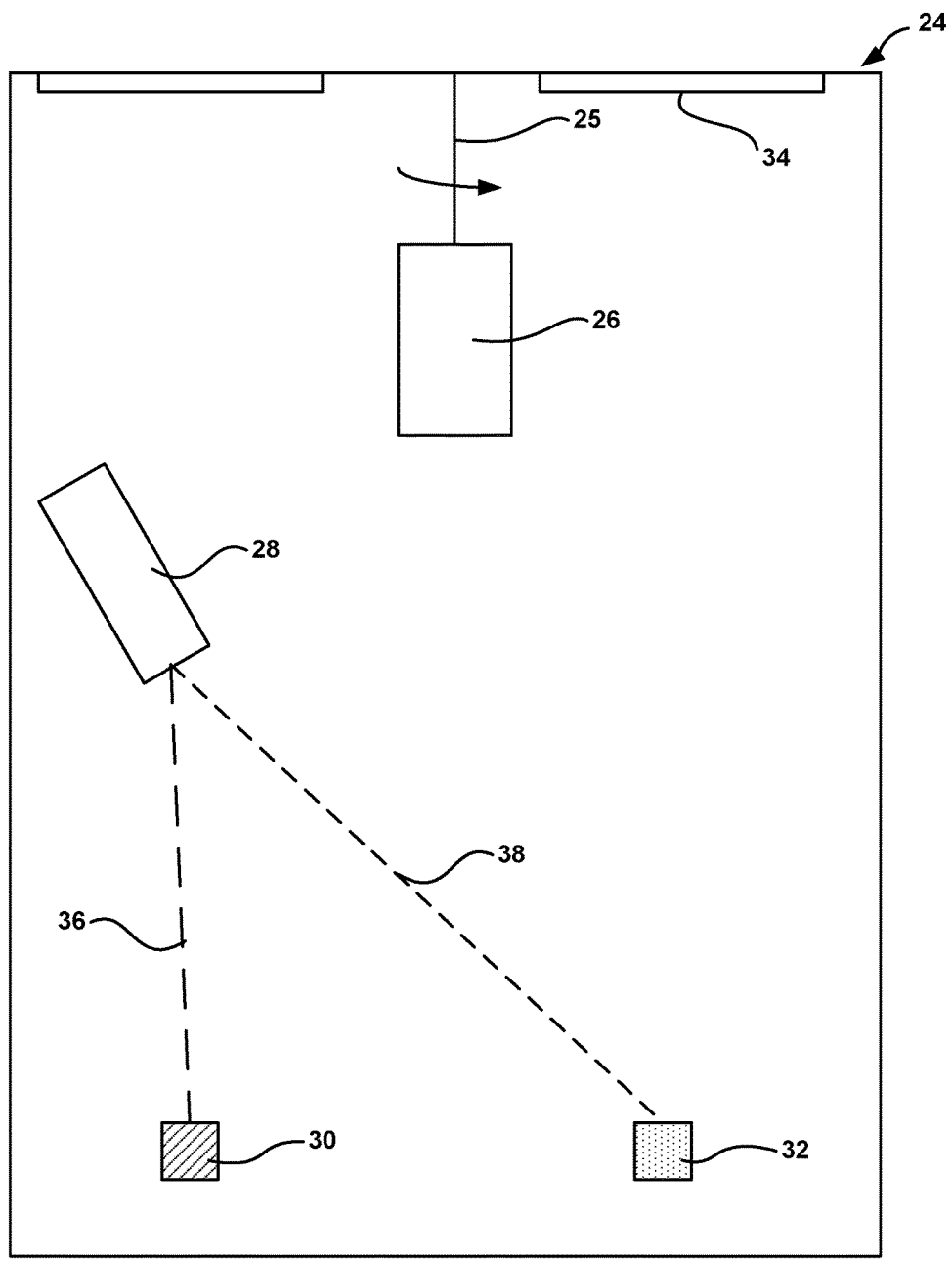
FIG. 2 is a schematic diagram of an example of a vapor deposition chamber for coating a substrate from two different source materials.

FIG. 2 is a schematic diagram of a vapor deposition chamber 24 that may be used to deposit an EBC 14 (FIG. 1A) on a target substrate 26 using a first target material 30 and a second target 32.

As illustrated, vapor deposition chamber 24 encloses a target substrate 26 and an energy source 28. Energy source 28 is positioned to direct a first energy beam 36 toward a first portion of a first target material 30 and a second energy beam 38 toward a first portion of a second target material 32. In some embodiments, the energy beams 36, 38, may include electron beams. Energy source 28 can scan between first target material 30 and second target material 32 to deliver energy to first target material 30 and second target material 32 at different rates and/or for different amounts of time. In some embodiments, deposition chamber 24 operates at vacuum conditions that are generated through vacuum port 34. Further, target substrate 26 may be coupled to a stage 25 which rotates and/or translates in one or more directions during the vapor deposition process to facilitate uniform coating of the substrate 26.

First target material 30 and second target material 32 may include any elements and/or compounds that are deposited on target substrate 26 to form an EBC 14. In some examples, first target material 30 includes at least one rare earth oxide (e.g., $RE_2O_3$, where RE is a rare earth element) while second target material 32 includes silica. Suitable rare earth elements that may form part of a rare earth oxide composition may include La, Pr, Nd, Pm, Sm, Eu, Gd, Tb, Dy, Ho, Er, Tm, Yb, Lu, Y, or Sc. In some embodiments, a vaporized portion of first target material 30 may react during or after deposition on target substrate 26 with a vaporized portion of second target material 32 to form an EBC composition. For example, vaporized rare earth oxide may react with vaporized silica to form a rare earth monosilicate and/or a rare earth disilicate.

Additional or different target materials optionally may be used in vapor deposition chamber 24, as will be described below. In some examples, one or more additional target materials may be used with first target material 30 and second target material 32 to change the properties of an EBC 14 formed from first target material 30 and second target material 32. Additional target materials may include $Al_2O_3$, $TiO_2$, $Ta_2O_5$, $HfSiO_4$, $ZiSiO_4$, an alkali metal oxide, an alkali earth metal, or combinations thereof.

Alternatively or additionally, vapor deposition chamber 24 may be used to deposit different types of layers other than an EBC 14. For example, vapor deposition chamber 24 may be used to form a layer that resists chemical attack by calcia-magnesia-alumina-silicate deposits. Accordingly, first target material 30 may include a rare earth oxide while second target material 32 may include alumina. In some examples, additional target materials may used to form a layer that resists calcia-magnesia-alumina-silicate deposits.

For example, an additional target material may include silica. Alternatively, multiple additional target materials may include a target material of silica and at least one target material selected from the group of $Ta_2O_5$, $HfSiO_4$, $TiO_2$, alkali oxides, and alkali earth oxides.

Regardless of the specific number or composition of target materials 30, 32, a target material 30, 32 can have any suitable size and shape. The size and shape of a target material 30, 32 may vary based, for example, on the configuration of vapor deposition chamber 24 and the size or shape of substrate 26 to be coated. In some examples, a target material 30, 32 may take the shape of an ingot.

Vapor deposition chamber 24 may be configured for different deposition techniques. For example, vapor deposition chamber 24 may be configured for EB-PVD. In general, EB-PVD uses high-energy beams 36, 38 including electrons that are generated from one or more electron guns. Accordingly, energy source 28 may be an electron gun. As described above, the energy beam may conceptually be referred to as a first energy beam 36, which is directed onto first target material 30 and a second energy beam 38, which is directed onto second target material 32. In some embodiments, energy source 28 is controlled to variably direct the energy beam onto first target material 30 and second target material 32 to melt and evaporate portions of target materials 30, 32. In this manner, first energy beam 36 and second energy beam 38 may, in fact, be a single energy beam which is scanned such that the beam 36, 38 is alternately directed to first target material 30 and second target material 32. In other examples, first energy beam 36 and second energy beam 38 may be discrete energy beams and may be generated at different times by a single energy source 28, as illustrated in FIG. 2, or may be generated by two separate energy sources.

In the example of FIG. 2, vapor deposition chamber 24 includes vacuum port 34. A vacuum may be drawn through vacuum port 34 using, for example, a vacuum pump or gas injectors system. The number, type, or positioning of vacuum port 34 is not critical. In some examples, vacuum port 34 facilitates gas flow in vapor deposition chamber 24 to promote migration of vaporized target material to substrate 26. In some examples, vapor deposition chamber 24 may operate between atmospheric pressure and a pressure of approximately $1 \times 10^{-8}$ Pascals ($1 \times 10^{-10}$ millibar). In other examples, such as when vapor deposition chamber 24 is configured for EB-PVD, vapor deposition chamber 24 may operate at a vacuum between approximately $1 \times 10^{-6}$ Pascals ($1 \times 10^{-8}$ millibar) and approximately 0.01 Pascals (0.0001 millibar). In additional or alternative examples, such as when vapor deposition chamber 24 is configured for DVD, vapor deposition chamber 24 may operate at a vacuum between approximately 0.1 Pascals (0.001 millibar) and approximately 100 Pascals (1 millibar).

In some embodiments, a pressure gradient is created across deposition chamber 24 via vacuum port 34, thereby allowing vaporized portions of first target material 30 and second target material 32 to migrate to a surface of target substrate 26. Upon reaching target substrate 26, the vaporized portions of target materials 30, 32 may deposit on the surface of target substrate 26. In some embodiments, at least some of the portions of target materials 30, 32 may react to form a different composition (e.g., a different composition than that of individual target materials 30 and 32). For example, when first target material 30 includes a rare earth oxide and second target material 32 includes silica, at least some of the rare earth oxide and silica may react to form a rare earth monosilicate and/or a rare earth disilicate. In some cases, target substrate 26 is rotated and/or translated in vapor deposition chamber 24 to promote the formation of an EBC 14 of substantially uniform thickness on target substrate 26.

In some embodiments, vapor deposition chamber 24 may alternatively be configured for directed vapor deposition (DVD). DVD may be similar to EB-PVD in that an energy source 28 which generates an electron beam operates in a deposition chamber 24 with a pressure gradient. Additionally, the DVD process may also include one or more gas streams that direct the clouds of vaporized target materials 30, 32 onto target substrate 26. For instance, a gas stream may operate at transonic conditions and may include, but is not limited to, oxygen, nitrogen, helium, and combinations thereof. In this manner, a DVD process may provide more coating control than an EB-PVD process. Additional control of vaporized target materials 30, 32 may improve coating formation and/or coating uniformity on target substrate 26. For example, a DVD process may improve coating uniformity on surfaces of substrate 26 that are not readily exposed to a cloud of vaporized target material 30, 32 without direction of the cloud of vaporized target material 30, 32, such as surfaces that are not in a line-of-sight between first target material 30 and substrate 26 and/or second target material 32 and substrate 26.

In other embodiments, vapor deposition chamber 24 may take other configurations. For example, energy source 28 may not be an electron beam source but instead may be a different type of energy source. Any type of energy source 28 that can vaporize a portion of a target material 30, 32 for subsequent deposition on target substrate 26 can be employed. For example, energy source 28 may be a laser and vapor deposition chamber 24 may be configured for laser deposition techniques.

As seen in FIG. 2, a single energy source 28 may direct an energy beam entirely at first target material 30, entirely at second target material 32, or variably at first target material 30 and second target material 32.

In alternate examples, vapor deposition chamber 24 may include multiple energy sources. For example, a first energy source may used to vaporize a portion of first target material 30 and a second energy source may be used to vaporize a portion of second target material 32. This concept may be extended to any number of energy sources and target materials. In some embodiments, a number of energy sources and a number of target materials may not be equal, and an energy source may be utilized to deliver energy to more than one target material. Any suitable number of energy sources may be included in vapor deposition chamber 24.

Regardless of the specific number of energy sources included in vapor deposition chamber 24, each energy source 28 can direct an energy beam 36, 38 (collectively, "energy beam 36"), such as an electron beam, at a target material 30, 32. Energy beam 36 may include a continuous waveform, a pulsed waveform, or a weaved waveform which includes continuous and/or pulsed segments. Further, energy beam 36 may be directed at a single spot on a target material 30, 32 or beam 36 may be translated across a surface of target material 30, 32 to achieve vaporization of portions of the target material 30, 32 at different locations along the surface of the target material 30, 32. In some examples, energy beam 36 may be translated across a surface of target material 30, 32 to provide substantially uniform heating of the target material 30, 32, such that vaporization of the material 30, 32, is substantially uniform across the surface of material 30, 32. In some examples, energy beam 36 may be focused to a beam spot size less than approximately 1.0 mm, such as less than approximately 0.5 mm, or less than approximately 0.35 mm.

When a single energy source 28 directs an energy beam 36 to multiple target materials 30, 32, such as energy source 28 in FIG. 2, the energy source 28 may alternately direct different energy beams 36, 38 to the different target materials 30, 32. The rate at which energy source 28 switches direction of energy beam 36 between different target materials 30, 32 may be referred to as a scanning frequency. In some examples where energy source 28 directs a first energy beam 36 to first target material 30, which includes a rare earth oxide, and directs a second energy beam 38 to second target material 32, which includes silica, a scanning frequency of energy source 28 may be between approximately 3 and approximately 20 hertz, such as between approximately 5 and approximately 15 hertz.

In some embodiments, energy source 28 may direct first energy beam 36 at first target material 30 and second energy beam 38 at second target material 32 in a manner which leads to deposition of portions of first target material 30 and second target material 32 on target substrate 26 in a single layer. In such embodiments, vaporized portions of the first target material 30 and vaporized portions of the second target material 32 may be considered to be substantially simultaneously deposited on target substrate 26. In some embodiments, this may indicate that portions of first target material 30 and portions of second target material 32 mix when deposited to form a layer on target substrate 26, e.g., portions of first target material 30 and second target material 32 form a single layer instead of a plurality of sub-layers of material from first target material 30 and second target material 32, respectively. In some embodiments, the layer deposited from first target material 30 and second target material 32 may be substantially homogeneous, and may include portions of first target material 30, portions of second target material 32, and/or at least one product formed from reaction of portions of first target material 30 and second target material 32.

The operating power of energy source 28 and the division of energy delivered from energy source 28 to first target material 30 and second target material 32 may vary based on, for example, the chemical compositions of first target material 30 and second target material 32, the desired composition of the layer to be formed from first target material 30 and second target material 32 (e.g., the composition of an EBC 14), and the configuration of vapor deposition chamber 24. In the illustrated example of FIG. 2, where energy source 28 directs first energy beam 36 to first target material 30 and directs second energy beam 38 to second target material 32, energy source 28 may utilize operating parameters which result in formation of an EBC including a rare earth silicate on target substrate 26. For example, energy source 28 may be an electron beam gun that operates at a power between approximately 5 KW and approximately 50 KW. In some embodiments, energy source 28 may operate at a power between approximately 10 KW and approximately 30 KW, or between approximately 12.5 KW and approximately 25 KW.

In some embodiments, energy source 28 may direct relative amounts of energy to produce a vapor phase composition of first target material 30 and a vapor phase composition of second target material 32 which is substantially similar to the desired composition of the layer to be deposited on target substrate 26. As described above, first target material 30 may and second target material 32 may have a different vapor pressure, and thus a different rate of vaporization, at a similar temperature and pressure. Hence, when energy source 28 delivers a similar amount of energy to first target material 30 and second target material 32, this may not cause similar amounts of first target material 30 and second target material 32 to vaporize. Similarly, when energy source 28 delivers a specified ratio of energy to first target material 30 and second target material 32, this may not cause a similar ratio of first target material 30 and second target material 32 to vaporize. Accordingly, energy source 28 may deliver a ratio of energy to first target material 30 and second target material 32 to cause vaporization a desired ratio of first target material 30 and second target material 32.

For example, in some embodiments in which first target material 30 includes a rare earth oxide and second target material 32 includes silica, energy source 28 may deliver to first target material 30 between approximately 50% and approximately 75% of the total energy delivered to first and second target materials 30, 32 and may deliver to second target material 32 between approximately 25% and approximately 50% of the total energy delivered. In other examples, energy source 28 may deliver to first target material 30 between approximately 52.5% and approximately 62.5% of the total energy delivered to first and second target materials 30, 32, or between approximately 56.5% and approximately 59.5% of the total energy delivered to first and second target materials 30, 32. Energy source 28 may direct the remaining amount of energy to second target material 32.

The amount of energy delivered to first target material 30 and second target material 32 may be controlled by controlling, for example, a relative amount of time for which energy source 28 directs first energy beam 36 onto first target material 30 and second energy beam 38 onto second target material 32, a relative power of first energy beam 36 and second energy beam 38, or the like. In cases where energy source 28 delivers energy at a substantially constant rate, the relative amount of energy directed to first target material 30 and second target material 32 may be equivalent to a residence time for energy delivery to each target material 30, 32. In other words, when energy source 28 delivers energy at a substantially constant rate, the amount of time that energy source 28 directs first energy beam 36 onto first target material 30 versus the amount of time that energy source 28 directs second energy beam 38 onto second target material 32 may be equivalent to the energy ratio between the two target materials 30, 32. In some examples, energy source 28 may direct first energy beam 36 onto first target material 30 between approximately 52.5% and approximately 62.5% of the total time that energy is being delivered to first and second target materials 30, 32, while energy source 28 may direct second energy beam onto second target material 32 between approximately 37.5% and approximately 47.5% of the total amount of time that energy is delivered to first and second target materials 30, 32.

As will be appreciated, the relative amount of energy delivered by energy source 28 to first target material 30 and second target material 32 may vary based on, for example, the number of target materials 30, 32, the composition of the target materials 30, 32, and/or the number of energy sources in vapor deposition chamber 24. Accordingly, energy delivery may be characterized as a ratio of energy delivered to first target material 30 to energy delivered to second target material 32. In some examples, the ratio may be between approximately 1:1 and approximately 3:1, such as between approximately 1.1:1 and approximately 1.7:1 or between approximately 1.33:1 and approximately 1.47:1.

In addition, different parameters may be controlled within vapor deposition chamber 24 to form different EBC microstructures. An EBC may exhibit a substantially nonporous dense microstructure or a columnar microstructure, as discussed with respect to FIG. 1. Parameters that may be adjusted to control the microstructure of an EBC include, but are not necessarily limited to, the temperature of target substrate 26 and the rate at which target substrate 26 rotates within vapor deposition chamber 24. In some examples, a substrate temperature less than approximately 1000° C., such as, e.g., a substrate temperature less than approximately 975° C. may result in a dense microstructure EBC. Conversely, a substrate temperature greater than approximately 1000° C., such as, e.g., a substrate temperature greater than approximately 1100° C. may result in a columnar microstructure EBC. In some examples, rotating target substrate 26 at a rate of less than 10 revolutions per minute, such as, e.g., less than 5 revolutions per minute may result in a dense microstructure. Conversely, rotating target substrate 26 at a rate greater than 10 revolutions per minute, such as, e.g., greater than 18 revolutions per minute may result in a columnar microstructure.

In some examples, at least one of a substrate temperature and a substrate rotation rate parameter may be controlled to produce an EBC with either a dense microstructure or a columnar microstructure, while in other examples, both a substrate temperature and a substrate rotation rate parameter may controlled together to produce an EBC with either a dense microstructure or a columnar microstructure. Values other than those presented above are contemplated, however, and it should be appreciated that parameters leading to either a dense microstructure or a columnar microstructure may vary, e.g., based on the specific target materials being used and the configuration of the specific vapor deposition chamber being used.

Vapor deposition chamber 24 may be used to form EBCs of different thicknesses. In general, a thickness of an EBC is measured in the X direction shown in FIG. 1. In some examples, a thickness of an EBC is less than approximately 100 mils (i.e., 0.1 inches or 2.54 millimeters). For example, a thickness of an EBC may be between approximately 1 mil (approximately 0.0254 millimeters) and approximately 10 mils (approximately 0.254 millimeters). Other thicknesses are possible, however, and the disclosure is not limited in this regard.

Figure 3:
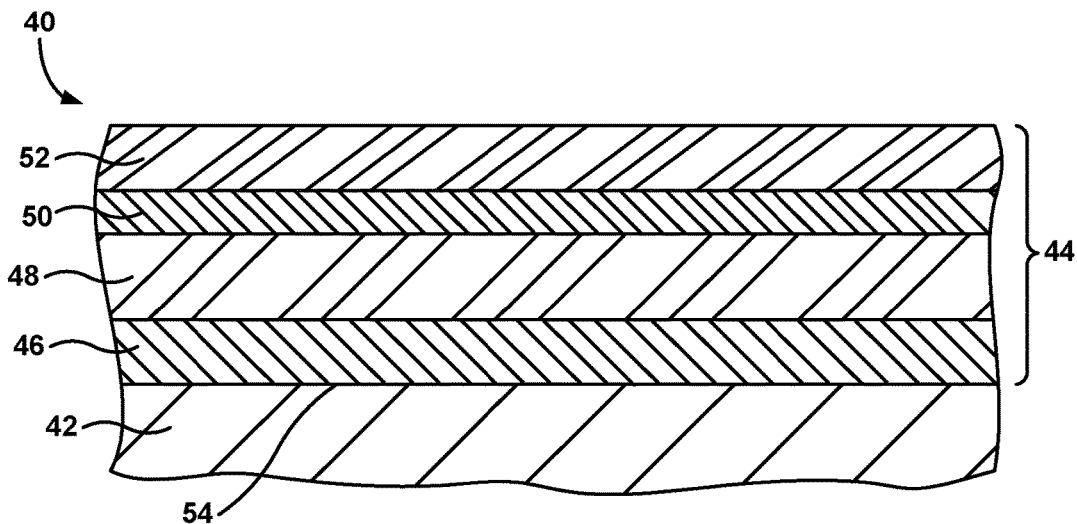
FIG. 3 is a cross-sectional schematic diagram of an example of a substrate coated with a multi-layered environmental barrier coating

By using the techniques described herein, one or more layers can be coated onto a substrate. FIG. 3 is a cross-sectional schematic diagram of a substrate 42 coated with an example of a multi-layered EBC 44. Article 40 includes substrate 42. Multi-layered EBC 44 is formed over a first surface 54 of substrate 42. In the example illustrated in FIG. 3, multi-layered EBC 44 includes first EBC layer 46, second EBC layer 48, third EBC layer 50, and fourth EBC layer 52. One or more of EBC layers 46, 48, 50, and 52 (collectively, (EBC layers 46") can be formed using vapor deposition chamber 24 (FIG. 2). Each EBC layer 46 may be formed from similar EBC materials or dissimilar EBC materials. Further, each EBC layer 46 may have a similar microstructure or a dissimilar microstructure.

As an example, first EBC layer 46 may have a dense microstructure that may substantially prevent an environmental species, such as water vapor, from contacting first surface 54 of substrate 42. Second EBC layer 48 may have a columnar microstructure that offers mechanical compliance, sintering resistance, and/or thermal protection. Third substrate layer 50 may be another dense microstructure layer to provide protection to substrate 42 from environmental species. Fourth substrate layer 52 may be another columnar microstructure for mechanical compliance and/or thermal protection. In this manner, a multilayered EBC 44 may be constructed to address different operating conditions that a coated substrate 42 may experience.

At least some of EBC layers 46, 48, 50, 52 may be deposited using the techniques discussed above with respect to FIG. 2 using vapor deposition chamber 24. For example, EBC layers 46, 48, 50, and 52 may all be deposited from one or more target materials disposed in vapor deposition chamber 24. In some embodiments, layers 46, 48, 50 and 52 may be deposited sequentially in a substantially continuous deposition process. That is, layers 46, 48, 50, and 52 may be continuously formed by in-situ changing of operating parameters of energy source 28 and/or by redirecting energy source 28 to different target materials to form layers 46, 48, 50, and 52. The layers 46, 48, 50, 52 may also be deposited discontinuously. For example, first EBC layer 46 may be initially formed, the deposition process may be paused to, e.g., change energy source 28 operating parameters, redirect energy source 28 to different target materials, or to subject first EBC layer 46 to a post-deposition heat treatment. Second EBC layer 48 may then be formed on first EBC layer 46.

In some embodiments, different EBC layers 46, 48, 50 ,52 of article 40 may be deposited using different techniques, one or more of which utilizes techniques described with reference to FIG. 2 and vapor deposition chamber 24. For example, first EBC layer 46 may be deposited using plasma spraying, a slurry process, or CVD. Second EBC layer 48 may then be deposited using a technique described with reference to FIG. 2 and vapor deposition chamber 24. Third EBC layer 50 and fourth EBC layer 52 may then be deposited using, for example, vapor deposition chamber 24 or one or more of the techniques used to deposit first EBC layer 46.

Although article 40 is shown with four adjacently positioned EBC layers 46, 48, 50, 52, it should be appreciated that EBC 44 may include a different number of layers, ranging from a single layer to a plurality of layers. The specific number of EBC layers 46, 48, 50, 52 may depend on the conditions in which substrate 42 will operate, the thickness and chemical composition of each EBC layer 46, 48, 50, 52, or other performance considerations.

In some embodiments, a high-temperature mechanical system component may receive additional coating layers beyond the EBC or EBC layer(s) discussed above (e.g., EBC 14 of FIG. 1A, first EBC layer 16 and second EBC layer 18 of FIG. 1B, or EBC layers 46, 48, 50, 52 of FIG. 3). As an example, a substrate may receive a bond coat layer in addition to an EBC. The bond coat may promote adhesion between layers or between the substrate and a layer. In some situations, a bond coat may enhance the adherence of an EBC to a substrate, thereby improving the durability of the article over its service life.

Figure 4:
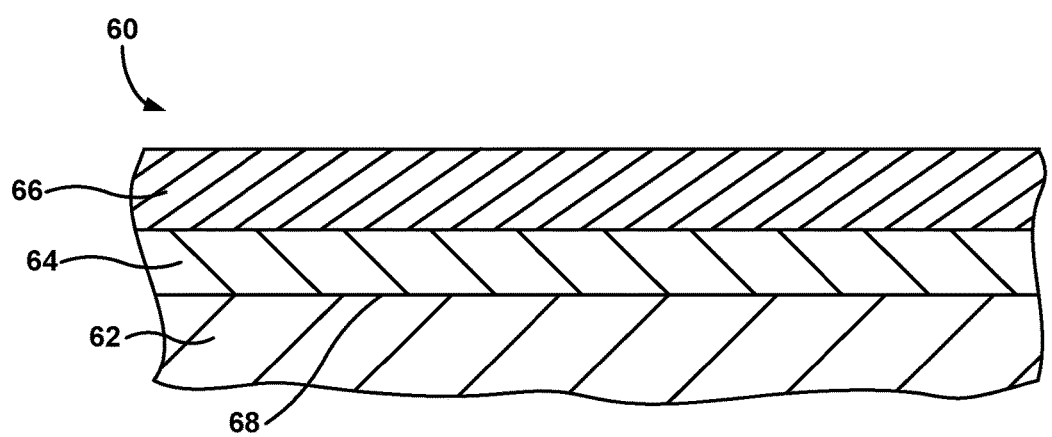
FIG. 4 is a cross-sectional schematic diagram of an example of a substrate coated with a bond coat and an environmental barrier coating.

FIG. 4 is a cross-sectional diagram of an article 60 that includes a bond coat layer. Specifically, article 60 includes substrate 62. A bond coat 64 is formed over a first surface 68 of substrate 62. An EBC 66 is further formed over bond coat 64.

As noted, bond coat 64 may promote adhesion between layers underlying and overlying bond coat 64, e.g., between substrate 62 and EBC 66. Bond coat 64 may include ceramics or other materials that are compatible with an underlying layer and an overlying layer. For example, when substrate 62 includes a ceramic or CMC, bond coat 64 may include silicon, mullite, a rare earth oxide, or combinations thereof In some examples, bond coat 64 includes an additive. For example, suitable additives include silicon, silicides, alkali metal oxides, alkali earth metal oxides, mullite, glass ceramics, $Al_2O_3$, $TiO_2$, $Ta_2O_5$, $HfO_2$, $ZrO_2$, $HfSiO_4$, $HfTiO_4$, $ZrTiO_4$, or combinations thereof.

Bond coat 64 may be formed to any suitable thickness, such as a thickness that facilitates adhesion between substrate 62 and EBC 66 to provide protection to article 60 as described herein. For example, bond coat 64 may have thickness between approximately 0.1 mils (approximately 0.00254 millimeters; 1 mil=0.001 inch) and approximately 5 mils (approximately 0.127 millimeters). In some cases, bond coat 64 may have thickness between approximately 0.5 mils (approximately 0.0127 millimeters) and approximately 5 mils (approximately 0.127 millimeters), such as between approximately 1 mils (approximately 0.0254 millimeters) and approximately 4 mils (approximately 0.1016 millimeters), or between approximately 2 mil (approximately 0.0508 millimeters) and approximately 4 mils (approximately 0.1016 millimeters).

Although shown as a single layer, in some examples, bond coat 64 includes multiple layers. In some implementations, a bond coat 64 that includes multiple layers may be desirable because each layer may provide different characteristics to the multilayer bond coat 64. For example, one bond coat layer may promote adhesion between substrate 62 and EBC 66. Continuing the example, another bond coat layer may provide chemical compatibility between substrate 62 and EBC 66.

Additionally or alternatively, multiple bond coat layers may provide thermal expansion grading. For example, different bond coat layers may exhibit different thermal expansion coefficients. A bond coat layer near substrate 62 may have a thermal expansion coefficient similar to substrate 62 while a bond coat layer near EBC 66 may have a thermal expansion coefficient similar to EBC 66. An intermediate bond coat layer may have a thermal expansion coefficient that is between the thermal expansion coefficient of the bond coat layer near substrate 62 and the thermal expansion coefficient of the bond coat layer near EBC 66. In this manner, different bond coat layers can compensate for different coefficients of thermal expansion exhibited by substrate 62 and EBC 66.

Bond coat 64 may be applied to substrate 62 using any suitable deposition technique. For example, bond coat 64 may be applied to substrate 62 using vapor deposition chamber 24 (FIG. 2). Alternatively, bond coat 64 may be applied to substrate 62 using other techniques, such as plasma spraying, a slurry process, or CVD.

Although bond coat 64 may be applied to substrate 62, article 60 may not always include bond coat 64. EBC 66 may be applied on substrate 62 without bond coat 64. In some cases, an additive may be directly incorporated into EBC 66 to increase adherence between EBC 66 and substrate 62 or another layer formed between substrate 62 and EBC 66. Examples of suitable additives include silicon, silicides, alkali metal oxides, alkali earth metal oxides, mullite, $Al_2O_3$, $TiO_2$, $Ta_2O_5$, $HfO_2$, $ZrO_2$, $ZrSiO_4$, $HfSiO_4$, $HfTiO_4$, $ZrTiO_4$, glass ceramics (including, for example, barium strontium alumina silicate ($BaO_x$—$SrO_{1-x}$—$Al_2O_3$-$2SiO_2$), a barium alumina silicate (BaO—$Al_2O_3 2SiO_2$), a strontium alumina silicate (SrO—$Al_2O_3$-$2SiO_2$), a calcium alumina silicate (CaO—$Al_2O_3$-$2SiO_2$), a magnesium alumina silicate ($2MgO$-$2Al_2O_3$-$5SiO_2$), and a lithium alumina silicate ($Li_2O$—$Al_2O_3$-$2SiO_2$)), and combinations thereof In some examples, EBC 66 may include a rare earth silicate and an additive selected from the group consisting of $Al_2O_3$, $TiO_2$, $Ta_2O_5$, $HfSiO_4$, $ZrSiO_4$, alkali metal oxides, alkali earth metal oxides, and combinations thereof. As another example, EBC 66 may include a rare earth alumino silicate.

In some embodiments, EBC 66 may include between approximately 5 weight percent and 60 weight percent additive material, such as between approximately 35 weight percent 55 weight percent additive material. For example, EBC 66 may include greater than or equal to approximately 50 weight percent rare earth silicate and less than or equal to approximately 50 weight percent additive. Regardless of the specific amount of additive, EBC 66 that includes an additive may be any thickness suitable to provide protection to substrate 62. For instance, an EBC 66 that includes an additive may fall within the range of EBC thicknesses discussed above.

EBC 66 may include any composition and microstructure described herein with reference to other EBCs or EBC layers. For example, EBC 66 may include a rare earth silicate, a rare earth oxide, and/or silica. In some embodiments, EBC 66 may include at least one additive, as described above. Additionally, EBC 66 may include a substantially porous microstructure or a columnar microstructure.

Although article 60 is depicted in FIG. 4 as including an EBC 66 formed in a single layer, in other embodiments, an article may include a bond coat 64 and an EBC 66 including more than one layer. For example, an article may include a bond coat 64 formed on substrate 62 and a multilayer EBC, such as EBC 15 illustrated in FIG. 1B or EBC 44 illustrated in FIG. 3. Additionally or alternatively, an article may include a bond coat 64 formed on substrate 62, an single layer or multilayer EBC formed on bond coat 64, and, optionally, an overlay coating, as will be described below with reference to FIG. 6. Any suitable methods may be used to incorporate additive material into EBC 66. In some cases, an additive material may be deposited by using at least one target material in vapor deposition 24 (FIG. 2). The at least one target material may include at least a first target material that includes a rare earth oxide, a second target material that includes silica, and a third target material that includes an additive material.

Figure 5:
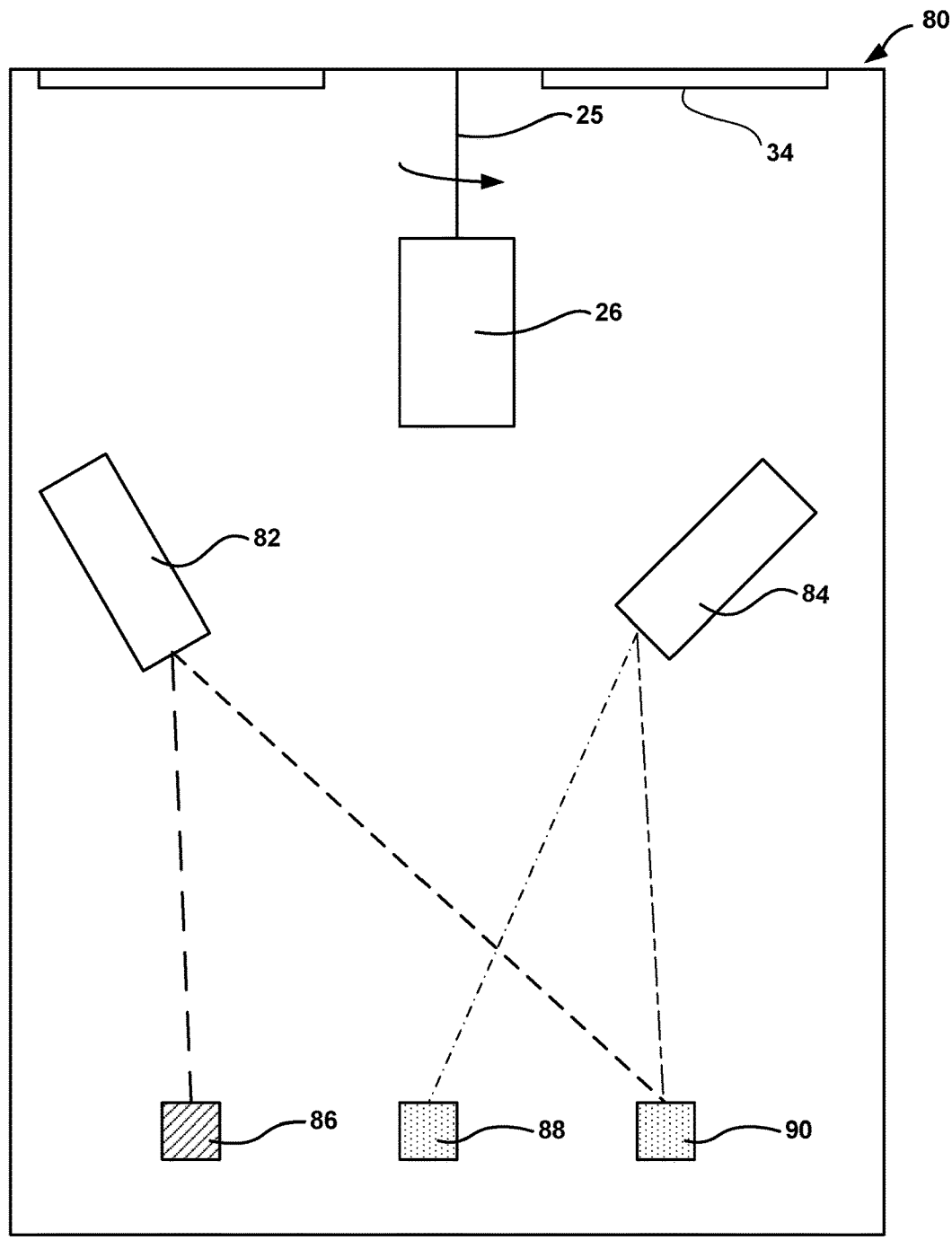
FIG. 5 is a schematic diagram of an example of a vapor deposition chamber for coating a substrate from three different source materials.

FIG. 5 is a schematic diagram of a vapor deposition chamber 80 for coating substrate 26 using a plurality of different target materials. As illustrated, vapor deposition chamber 80 encloses target substrate 26, first energy source 82, and second energy source 84. First energy source 82 is positioned to direct an electron beam toward a portion of a first target material 86 and toward a portion of a third target material 90. Second energy source 84 is positioned to direct an electron beam toward a portion of a second target material 88 and toward a portion of the third target material 90.

Vapor deposition chamber 80 may be substantially similar to or the same as vapor deposition chamber 24 and may be used in similar or the same configurations and under similar or the same operating conditions. For example, vapor deposition chamber 80 may be used for EB-PVD or DVD. In some examples, vapor deposition chamber 80 may operate at vacuum conditions or near vacuum conditions that are generated through vacuum port 34. Further, substrate 26 may be coupled to a stage 25 which rotates in one or more directions during the vapor deposition process to ensure uniform coating of the substrate 26.

In some embodiments, first energy source 82 and/or second energy source 84 may be an electron beam source. The electron beam sources may operate within the same range of parameters discussed above with respect to energy source 28. Although two energy sources 82, 84 are shown in FIG. 5 and each energy source is direct toward a pair of different target materials 86, 88, 90 (e.g., first energy source 82 is directed to first target material 86 and third target material 90 and second energy source 84 is directed to second target material 88 and third target material 90), in further examples, a different number or different configuration of energy sources 82, 84 may be used. The specific number and specific configuration of energy sources 82, 84 within a deposition chamber 80 that includes a plurality of target materials 86, 88, 90 may vary depending, for example, on desired coating rates, number of target materials 86, 88, 90 utilized, composition of target materials 86, 88, 90, or the like. For example, a single energy source may be used alone, as illustrated with respect to FIG. 2. The single energy source may be variably directed toward each of the various target materials 86, 88, 90 disposed within deposition chamber 80. In further examples, each target material 86, 88, 90 may have a dedicated energy source that operates only to a vaporize target material 86, 88, 90 assigned to the dedicated energy source. Regardless, vapor deposition chamber 80 may be used to vaporize target materials 86, 88, and 90, thereby creating an EBC that includes an additive.

Aside from the different number of energy sources 82, 84 and different number of target materials 86, 88, 90, vapor deposition chamber 80 may operate similarly to vapor deposition chamber 24 described with reference to FIG. 2. For example, energy sources 82, 84 may operate with parameters similar to energy source 28, including power, scanning rate, residence times, or the like. Of course, depending on the composition of target materials target materials 86, 88, 90, first energy source 82 and/or second energy source 84 may operate with parameters different from those described with respect to energy source 28. In any case, the operating parameters of vapor deposition chamber 80 and energy sources 82, 84 may be selected to produce a coating having a desired composition, microstructure, and thickness. For example, the operating parameters of vapor deposition chamber 80 and energy sources 82, 84 may be selected to produce an EBC including a rare earth aluminosilicate from a first target material 86 including a rare earth oxide, a second target material 88 including silica, and a third target material 90 including alumina. As described above, the operating parameters for energy sources 82, 84 may be selected based on, for example, relative heats of vaporization or relative vapor pressures of components of target materials 86, 88, 90, a desired composition of the coating to be formed on target substrate 26, or the like.

Additionally, in some embodiments, first energy source 82 and second energy source 84 may direct respective energy beams at first target material 86, second target material 88, and third target material 90 in a manner which leads to deposition of portions of target materials 86, 88, 90 on target substrate 26 in a single layer. In such embodiments, vaporized portions of the target materials 86, 88, 90 may be considered to be substantially simultaneously deposited on target substrate 26. In some embodiments, this may indicate that portions of target materials 86, 88, 90 mix when deposited to form a layer on target substrate 26, e.g., portions of the target materials 86, 88, 90 form a single layer instead of a plurality of sub-layers of material from first target material 86, second target material 88, and third target material 90, respectively. In some embodiments, the layer deposited from target materials 86, 88, 90 may be substantially homogeneous, and may include portions of first target material 86, portions of second target material 88, portions of third target material 90, and/or a product formed from reaction of portions of first target material 86, second target material 88, and/or third target material 90.

Beyond the coatings described above, a substrate for a high-temperature mechanical system component may sometimes receive different or additional coating layers. For example, a substrate for a high-temperature mechanical system component may receive an overlay coating.

Figure 6:
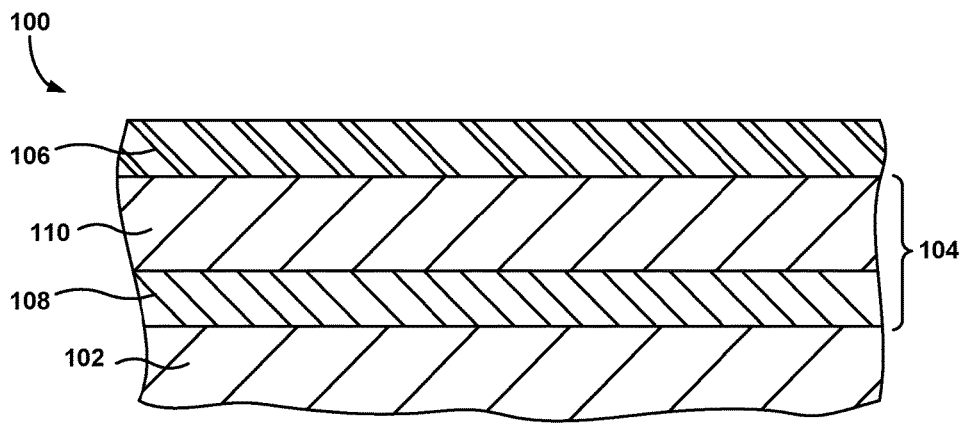
FIG. 6 is a cross-sectional schematic diagram of an example of a substrate coated with an environmental barrier coating and an overlay coating.

FIG. 6 is a cross-sectional diagram of an article 100 that includes an overlay coating 106. Article 100 includes EBC 104 formed over substrate 102. Overlay coating 106 is further formed over EBC 104. In the illustrated example, EBC 104 includes first EBC layer 108 and second EBC layer 110.

Substrate 102 may include, for example, a superalloy, a ceramic, CMC, or metal-silicon alloy. Substrate 102 may include any composition suitable for use in a high-temperature mechanical component, including, for example, any composition described herein.

EBC 104, and first EBC layer 108 and second EBC layer 110, may include any of the compositions described herein. In some examples, at least one of first EBC layer 108 or second EBC layer 110 may include a rare earth silicate, a rare earth oxide, and/or silica. In some examples the composition of first EBC layer 108 and second EBC layer 110 is substantially similar or the same. In other examples, the composition of first EBC layer 108 and second EBC layer 110 is different.

In some embodiments, at least one of first EBC layer 108 or second EBC layer 110 may be deposited over substrate 102 using a vapor deposition technique described herein, e.g., with reference to vapor deposition chamber 24 of FIG. 2 or vapor deposition chamber 80 of FIG. 5.

As described above with reference to FIG. 1B, in some examples, first EBC layer 108 may include a dense, substantially nonporous microstructure and second EBC layer 110 may include a columnar microstructure. In other examples, second EBC layer 110 may include a dense, substantially nonporous microstructure and first EBC layer 108 may include a columnar microstructure. In still other examples, first EBC layer 108 and second EBC layer 110 include a similar microstructure, which may be either substantially nonporous or columnar.

Although FIG. 6 illustrates EBC 104 as including first EBC layer 108 and second EBC layer 110, in other embodiments, EBC 104 may include a single layer or more than two layers. Other example constructions which EBC 104 may include are described with respect to FIGS. 1A and 1B, FIG. 3, FIG. 4, and FIG. 7.

In some embodiments, overlay coating 106 includes a CMAS-resistant overlay coating. A CMAS-resistant overlay coating may provide protection from chemical attack of EBC 104 and/or substrate 102 by CMAS deposits or physical infiltration of pores in underlying layers by CMAS. These types of deposits can form, for example, in a gas turbine engine when siliceous minerals such as dust, sand, volcanic ashes, runway debris, and the like are ingested into the engine with intake air. In some cases, the gas turbine engine may operate at temperatures above the melting point of components of CMAS, which may allow molten CMAS to infiltrate the pores or cracks of an underlying layer, such as second EBC layer 110 and/or first EBC layer 108. Infiltration of pores or cracks by CMAS may be particularly pernicious when an EBC layer 108, 110 is not substantially nonporous because the pores or cracks of the EBC layer 108, 110 may be larger in this configuration. Regardless, when a component is cooled below the CMAS melting temperature, the CMAS solidifies, which may exert strain on the infiltrated layer and reduce the service life of the coated article 100. CMAS-resistant layer 106 may help prevent infiltration of pores of second EBC layer 110 and/or first EBC layer 108 by CMAS deposits. Additionally or alternatively, CMAS-resistant layer 106 may reduce or substantially prevent chemical reaction between CMAS and a component of second EBC layer 110 and/or first EBC layer 108, which also may serve to reduce service life of article 100.

An overlay coating 106 which provides CMAS-resistance may include any materials that are useful for mitigating effects of CMAS. Examples of suitable materials may include a rare earth oxide, silica, alumina ($Al_2O_3$), an alkali oxide, an alkali earth oxide, $TiO_2$, $Ta_2O_5$, and $HfSiO_4$, or combinations thereof. For example, one or more rare earth oxides may be combined with alumina to form overlay coating 106. As another example, one or more rare earth oxides may be combined with alumina and silica to form overlay coating 106. A further combination for overlay coating 106 may include one or more rare earth oxides together with alumina, silica, and a component selected from the group consisting of alkali oxides, alkali earth oxides, $TiO_2$, $Ta_2O_5$, and $HfSiO_4$.

The thickness of overlay coating 106 may vary widely depending on the conditions under which article 100 is to be used. For example, if overlay coating 106 provides CMAS resistance and CMAS deposits are expected to be extensive, overlay coating 106 may be thicker than if CMAS deposits are not expected to be extensive. Additionally, the thickness of overlay coating 106 may vary depending on the operating environment (e.g., debris and temperatures) to which article 100 will be subject. Depending on the particular application, the thickness of overlay coating 106 may be between approximately 0.1 mils and approximately 60 mils. In some cases, the thickness of overlay coating 106 may be between approximately 0.1 mils and approximately 30 mils, such as between approximately 0.5 mils and approximately 15 mils.

In addition to, or instead of, a CMAS-resistant layer, overlay coating 106 may include a thermal barrier overlay coating (TBC). As discussed, TBCs may improve the performance of high-temperature mechanical system components by providing thermal insulation and may even allow a component to operate in an elevated temperature envelop. In some cases, EBC 104 may itself provide some thermal insulation to substrate 102. For instance, an EBC 104 including a rare earth silicate and having a columnar microstructure may exhibit characteristics consistent with a TBC. In other cases, however, a separate overlay 106 coating which is a TBC may be beneficially applied to EBC 104.

An overlay coating 106 including a TBC layer may include any materials that provide thermal protection for a high-temperature component. In some examples, overlay coating 106 may include a material and/or microstructure which results in the coating 106 exhibiting a relatively low effective coefficient of thermal conductivity (k). For example, overlay coating 106 may include yttria-stabilized zirconia (YSZ) compounds, compounds of zirconia stabilized by one or more rare earth oxides, zirconia-rare earth oxide compounds (such as $RE_2Zr_2O_7$ where RE represents a rare earth element), compounds of hafnia stabilized by one or more rare earth oxides, hafnia-rare earth oxide compounds (such as $RE_2Hf_2O_7$ where RE represents a rare earth element), rare earth silicate compounds (such as $RE_2Si_2O_7$, $RE_2SiO_5$ where RE represents a rare earth element), or combinations thereof.

The thickness of an overlay coating 106 including a TBC layer may vary depending on the specific TBC materials to be employed, the material structure of substrate 102, the composition and microstructure of EBC 104, and/or the operating conditions in which article 100 will be utilized. For example, if article 100 is expected to be used in a higher temperature envelope, overlay coating 106 may be thicker. Additionally, the thickness of overlay coating 106 may vary depending on the operating conditions under which article 100 is expected to be used. Depending on the particular application, the thickness of overlay coating 106 may range from between approximately 100 and 500 micrometers.

Overlay coating 106 may be applied using any suitable techniques. For example, a CMAS-resistant layer, a TBC layer, or both may be applied using vapor deposition chamber 24, 80. The different target materials in vapor deposition chamber 24, 80 may include the different constituent components of overlay coating 106. Alternatively, overlay coating 106 may be applied other EB-PVD or DVD methods, which rely on a single source of target material. In further examples, overlay coating 106 may be deposited using a CVD process, plasma spraying, or a slurry process.

When a CMAS-resistant layer or a TBC layer is formed using vapor deposition chamber 24, 80, the CMAS-resistant layer and/or the TBC layer may exhibit a dense, substantially nonporous microstructure or a columnar microstructure. Example techniques for creating a layer with a dense microstructure and a layer with a columnar microstructure are described above. These example techniques can be employed when creating a CMAS-resistant layer and/or a TBC layer.

Although CMAS-resistant coatings and TBC coatings are described in relation to overlay coating 106 for ease of description, a CMAS-resistant coating and/or a TBC coating need not be the outermost layer of article 100. In different examples, a CMAS-resistant coating and/or a TBC coating may be directly adjacent substrate 102 or interposed between various layers. For example, an article may include a substrate, an EBC layer formed over substrate, a CMAS-resistant layer formed over the EBC layer, and a TBC layer formed over the CMAS-resistant layer. In other examples, an article may include a substrate, an EBC layer formed over the substrate, a TBC layer formed over the EBC layer, and a CMAS-resistant layer formed over the TBC layer. In other embodiments, a CMAS-resistant coating and/or a TBC coating may even be interposed between two layers of a multi-layer EBC, e.g., EBC 104.

As discussed, a high-temperature mechanical system component may include multiple coating layers formed over a surface of the component. For example, a component may include an EBC, alone or in combination with at least one of a bond coat, a CMAS-resistant layer, a TBC layer, and combinations thereof. In some examples, a component may include additional layers. For example, one or more compositional transition layers may be formed between different coating layers, e.g., between an EBC layer and a CMAS-resistant layer, between an EBC layer and a TBC layer, and/or between a CMAS-resistant layer and a TBC layer. The one or more compositional transition layers may function to provide chemical and/or mechanical compatibility between the layers. For example, the one or more compositional transition layers may provide thermal expansion grading to compensate for the different coefficients of thermal expansion between different layers.

Figure 7:
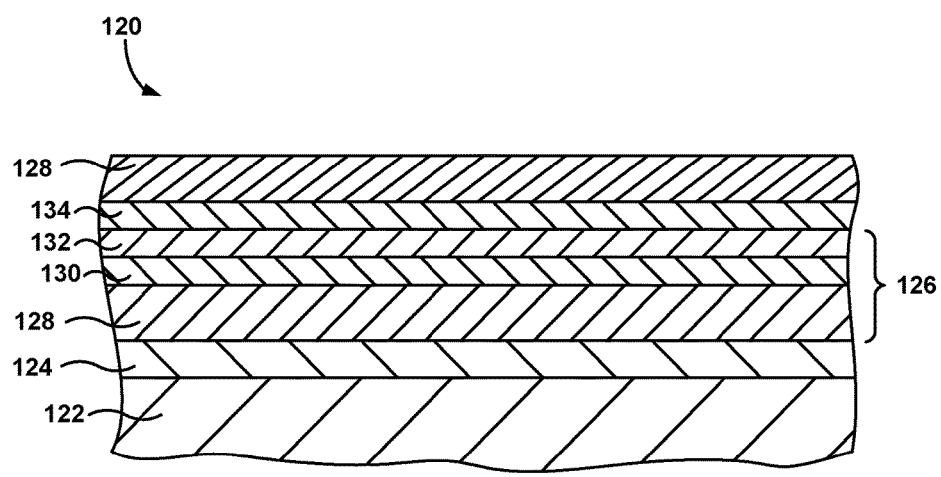
FIG. 7 is a cross-sectional schematic diagram of an example of a substrate coated with a bond coat, an environmental barrier coating, and an overlay coating.

FIG. 7 is a cross-sectional schematic diagram of an example article 120 that includes different coating layers. Article 120 includes substrate 122, such as a silicon-based ceramic matrix composite substrate. Bond coat 124 is formed over substrate 122, and EBC 126 is formed over bond coat 124. EBC 126 includes first EBC layer 128, second EBC layer 130, and third EBC layer 132. Compositional transition layer 134 is formed between third EBC layer 132 and CMAS-resistant layer 128. CMAS-resistant layer 128 forms the outermost layer for article 120.

Compositional transition layer 134 may function by providing compositional steps between layers of different materials. For example, compositional transition layer 134 may include materials from different adjacent layers that sandwich the compositional transition layer 134 (e.g., third EBC layer 132 and CMAS-resistant layer 128), thus providing a compositional transition between two layers. Further, as described, a compositional transition may be a single layer or may include multiple layers. For instance, article 120 may include three compositional transition layers between third EBC layer 132 and CMAS-resistant layer 128. Each compositional transition layer may include components that are used to form third EBC layer 132 and components that are used to form CMAS-resistant layer 128. A first compositional transition layer adjacent to third EBC layer 132 may include more components that are used to form third EBC layer 132 than components that are used to form CMAS-resistant layer 128. A second compositional transition layer may include an even blend (e.g., 50/50 mol percent ratio) of components used to form third EBC layer 132 and components used to form CMAS-resistant layer 128. A third compositional transition layer adjacent CMAS-resistant layer 128 may include more components that are used to form CMAS-resistant layer 128 than components that are used to form third EBC layer 132. In this manner, one or more compositional transition layers may provide compositional grading between layers of different materials.

Compositional transition layer 134 may be formed using any suitable techniques. For example, compositional transition layer 134 may be formed using vapor deposition chamber 24, 80. Target materials that are used to form the different layers between compositional transition layer 134 (e.g., third EBC layer 132 and CMAS-resistant layer 128) can be provided in vapor deposition chamber 24, 80. By controlling the vaporization rates of the different target materials, the specific composition of compositional transition layer 134 can be controlled and adjusted.

Compositional transition layer 134 can be deposited so the compositional transition layer 134 exhibits a dense, substantially nonporous microstructure or a columnar microstructure. Different example techniques for creating a layer with a dense microstructure versus a layer with a columnar microstructure are described above. The example techniques can be employed when creating compositional transition layer 134. For example, an article may include an EBC with a dense, substantially nonporous microstructure, a compositional transition layer formed over the EBC layer that exhibits a columnar microstructure, and a CMAS-resistant layer formed over the compositional transition layer that also exhibits a columnar microstructure. As another example, an article may include an EBC with a dense, substantially nonporous microstructure, a compositional transition layer formed over the EBC layer that exhibits a columnar microstructure, and two CMAS-resistant layers formed over the compositional transition layer, one of which exhibits a columnar microstructure and one of which exhibits a dense, substantially nonporous microstructure. The CMAS-resistant layer with the dense microstructure may be sandwiched between the columnar microstructure layers of the compositional transitional layer and the CMAS-resistant layer. Alternatively, the CMAS-resistant layer with the dense microstructure may form a top layer of an article.

While different numbers, types and configurations of layers have been described with respect to specific figures, it should be appreciated that this disclosure is not limited to the specific examples described and illustrated. Aspects of the various described examples may be combined, modified, or eliminated to produce hybrid layered structures beyond those explicitly discussed herein. For example, any of the EBCs described herein may be used in combination with at least one of a bond coat, a CMAS-resistant layer, a TBC, and/or at least one compositional transition layer.

The following examples provide additional details of some examples of EBCs and coating techniques in accordance with this disclosure.

EXAMPLES

Example 1

Figure 8A:
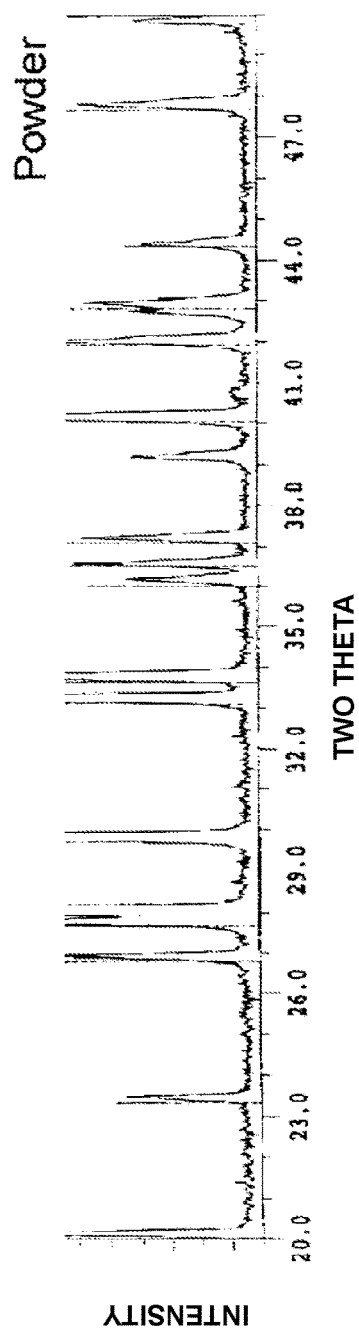
FIGS. 8A and 8B illustrate a pair of x-ray diffraction patterns for a powder of environmental barrier coating material and for an applied environmental barrier coating.
Figure 8B:
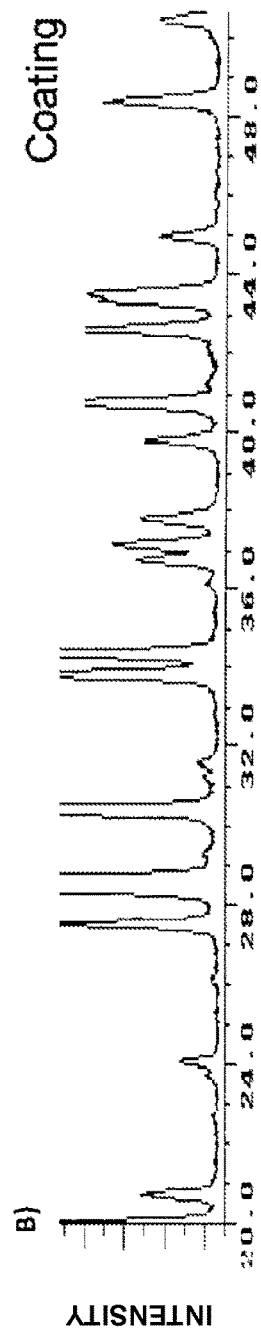

FIGS. 8A and 8B show examples of two x-ray diffraction patterns for different ytterbium disilicate ($Yb_2Si_2O_7$) materials. FIG. 8A is an x-ray diffraction pattern for an ytterbium disilicate power. FIG. 8B is an x-ray diffraction pattern for an EBC including ytterbium disilicate formed over a substrate. The ytterbium silicate EBC was formed using a DVD process that included two target materials. The first target material was an ingot that included ytterbium oxide. The second target material was an ingot that included silica. The similarity between the two x-ray diffraction patterns indicates that the EBC formed using the DVD process included ytterbium disilicate formed from reaction between ytterbium oxide and silica.

Example 2

Figures 9, 10:
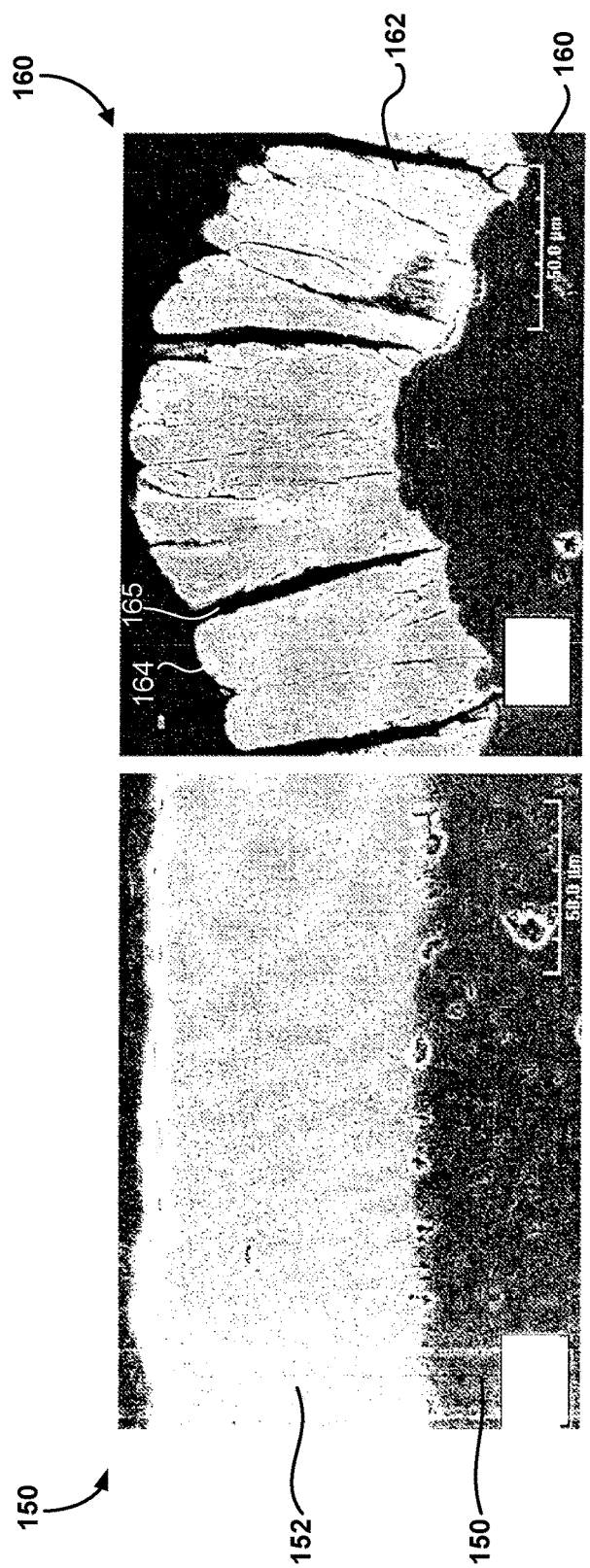
FIG. 9 is an enlarged image of an example of a dense microstructure environmental barrier coating created using a directed vapor deposition technique.
FIG. 10 is an enlarged image of an example of a columnar microstructure environmental barrier coating created using a directed vapor deposition technique.

FIG. 9 is a micrograph of an example of an article 150 that includes a ytterbium silicate EBC 152. EBC 152 was formed over substrate 150 using a DVD process that included two target materials. The first target material was an ingot that included ytterbium oxide. The second target material was an ingot that included silica. EBC 150 exhibits a dense microstructure that is substantially nonporous.

Example 3

FIG. 10 is a micrograph of an example of an article 160 that includes a ytterbium silicate EBC 162. EBC 162 was formed over substrate 160 using a DVD process that included two target materials. The first target material was an ingot that included ytterbium oxide. The second target material was an ingot that included silica. EBC 162 includes columns 164 separated by gaps 165. Columns 164 and gaps 165 define a columnar microstructure for EBC 162.

Example 4

Figure 11:
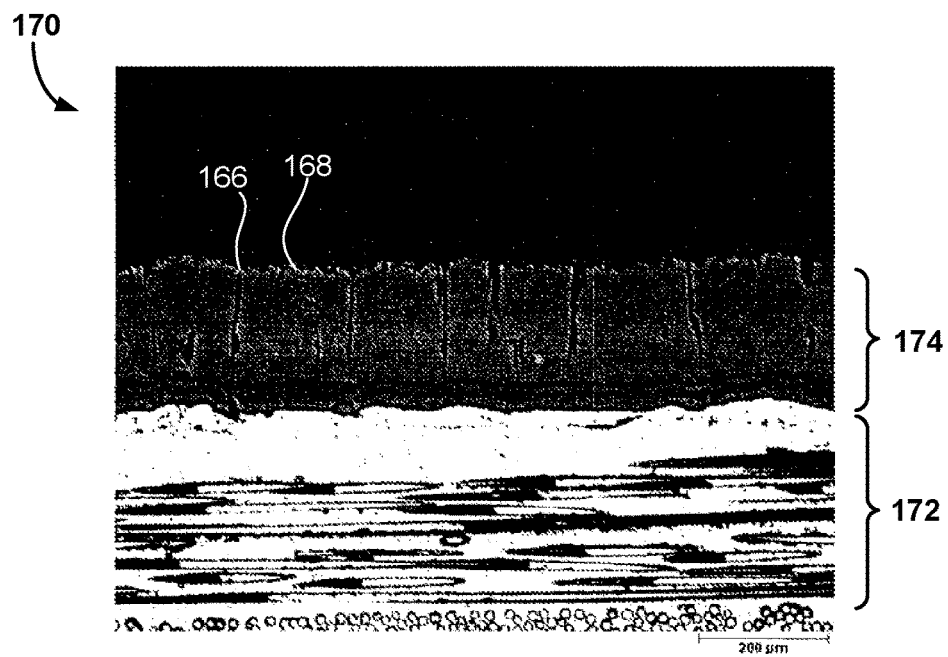
FIG. 11 is a cross-sectional image of an example of a substrate adjacent to an environmental barrier coating created using a directed vapor deposition technique. The entire structure was subject to thermal cycling.

FIG. 11 is a cross-sectional image of an article 170. Article 170 includes a ytterbium silicate environmental barrier coating 174 formed over substrate 172. Substrate 172 is a ceramic matrix composite substrate that includes a silicon carbide (SiC) ceramic and a silicon carbide filler material. Environmental barrier coating 174 was formed over substrate 172 using a directed vapor deposition process that included two target materials. The first target material was an ingot that included ytterbium oxide. The second target material was an ingot that included silica.

Article 170 was subject to 100 hours of thermal cycling with 1 hour cycles in an atmosphere with a partial pressure of water equal to 0.9 atmospheres prior to capturing FIG. 11. The thermal and moisture cycling were designed to simulate a combustion environment in a turbine engine. As illustrated, environmental barrier coating 174 exhibited no cracking, no delamination, and only minimal oxidation. Thus, FIG. 11 indicates that environmental barrier coatings formed using the materials and techniques described herein may be used to suitably protect a high temperature mechanical system component from high temperature cycling and reactive chemical species attack.

Example 5

Figure 12:
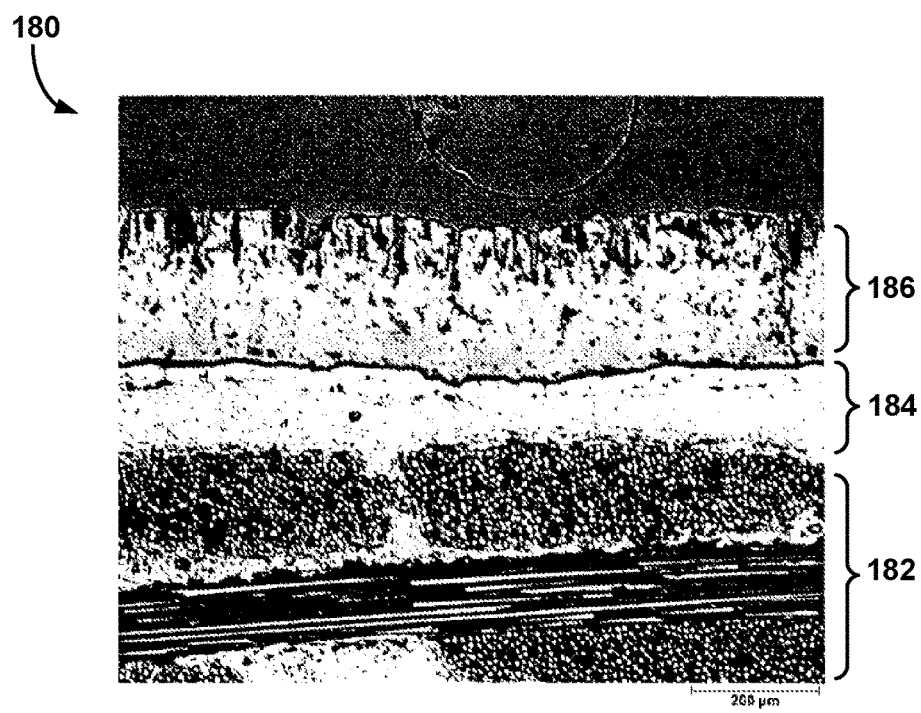
FIG. 12 is a cross-sectional image of an example of a substrate adjacent to a two layer environmental barrier coating created using a directed vapor deposition technique. The entire structure was subject to thermal cycling.

FIG. 12 is a cross-sectional image of an article 180 that includes a dual microstructure environmental barrier coating. Article 180 includes gadolinium silicate columnar microstructure environmental barrier coating 186 formed over a ytterbium silicate dense microstructure environmental barrier coating 184. Further, dense microstructure environmental barrier coating 184 is formed over substrate 182. Substrate 182 is a ceramic matrix composite substrate that includes a silicon carbide (SiC) ceramic and a silicon carbide filler material. Environmental barrier coatings 184 and 186 were both formed using a directed vapor deposition process that included two target materials. Environmental barrier coating 184 was formed from a first target material that was an ingot that included ytterbium oxide and a second target material that was an ingot that included silica. Environmental barrier coating 186 was formed from a third target material was an ingot that included gadolinium oxide and a fourth target material that was an ingot that included silica.

Like article 170 in FIG. 11 above, article 180 was subject to 100 hours of thermal cycling with 1 hour cycles in an atmosphere with a partial pressure of water equal to 0.9 atmospheres prior to capturing FIG. 12. The thermal and moisture cycling were designed to simulate a combustion environment in a turbine engine. As illustrated, environmental barrier coatings 184 and 186 exhibited no cracking, no delamination, and only minimal oxidation. FIG. 12 further indicates that environmental barrier coatings formed using the materials and techniques described herein may be used to suitably protect a high temperature mechanical system component from high temperature cycling and reactive chemical species attack.

Example 6

In this example, a ytterbium di-silicate environmental barrier coating was formed in a directed vapor deposition chamber that included a single electron beam energy source. The directed vapor deposition chamber included a first target material comprising ytterbium oxide and a second target material comprising silica. The target substrate was heated to approximately 970 degrees Celsius and rotated at 3 revolutions per minute to produce an environmental barrier coating that included a portion with a dense microstructure. The target substrate was then heated to approximately 1125 degrees Celsius and rotated at 20 revolutions per minute to produce an environmental barrier coating that include a portion with columnar microstructure. The electron beam energy source operated at approximately 22 kilowatts, and the electron beam was alternated between the first target material and the second target material at rate between approximately 5 and 10 kilohertz. As a result, the electron beam resided on the ytterbium oxide target material for approximately 58 percent of the deposition time while the electron beam only resided on the silica target material for approximately 42 percent of the deposition time.

The electron beam source was operated for approximately 35 minutes. Afterwards, the different target materials were weighted to determine the composition of the environmental barrier coating on the substrate. The electron beam source removed approximately 150 grams of ytterbium oxide from the first target material and approximately 130 grams of silica from the second target material, resulting in an evaporated mass ratio of ytterbium silicate to silica of approximately 1.14.

Example 7

Similar to Example 6, this example involved forming an environmental barrier coating in a directed vapor deposition chamber that included a single electron beam energy source. Unlike Example 6, however, this example focused on forming a gadolinium mono-silicate environmental barrier coating. The directed vapor deposition chamber included a first target material comprising gadolinium oxide and a second target material comprising silica. The target substrate was heated to approximately 1040 degrees Celsius and rotated at 3 revolutions per minute. The electron beam energy source operated at approximately 15 kilowatts, and the electron beam was alternated between the first target material and the second target material at rate between approximately 5 and 10 kilohertz. As a result, the electron beam resided on the gadolinium oxide target material for approximately 59 percent of the deposition time while the electron beam only resided on the silica target material for approximately 41 percent of the deposition time.

The electron beam source was operated for approximately 30 minutes. Afterwards, the different target materials were weighted to determine the composition of the environmental barrier coating on the substrate. The electron beam source removed approximately 75 grams of gadolinium oxide from the first target material and approximately 50 grams of silica from the second target material, resulting in an evaporated mass ratio of ytterbium silicate to silica of approximately 1.52.

Various examples have been described. These and other embodiments are within the scope of the following claims.

The invention claimed is:

1. A vapor deposition method comprising:
    applying a first electron beam for a first relative residence time to vaporize a portion of a first target material comprising a rare earth oxide, wherein the first electron beam delivers a first amount of energy over the first relative residence time;
    applying a second electron beam for a second relative residence time to vaporize a portion of a second target material comprising silica, wherein the second electron beam delivers a second amount of energy over the second relative residence time, wherein the first amount of energy is between approximately 1.1 and approximately 2 times greater than the second amount of energy, and wherein the second target material is separate from the first target material;
    wherein the portion of the first target material and the portion of the second target material are deposited substantially simultaneously over a substrate to form a layer over the substrate.

2. The vapor deposition method of claim 1, wherein the layer comprises a substantially nonporous microstructure.

3. The vapor deposition method of claim 1, wherein the layer comprises a substantially homogeneous composition.

4. The vapor deposition method of claim 1, wherein the first amount of energy is between approximately 1.33 and approximately 1.47 times greater than the second amount of energy.

5. The vapor deposition method of claim 1, wherein applying the first electron beam and applying the second electron beam comprise applying an electron beam from a single energy source, the single energy source alternating between applying the first electron beam and the second electron beam.

6. The vapor deposition method of claim 1, wherein the rare earth oxide is selected from the group consisting of an oxide of Gd, an oxide of Yb, and combinations thereof.

7. The vapor deposition method of claim 1, wherein the layer comprises a first layer, and further comprising:
applying a third electron beam to vaporize a portion of a third target material comprising a rare earth oxide, wherein the third electron beam delivers a third amount of energy;
applying a fourth electron beam to vaporize a portion of a fourth target material comprising silica, wherein the fourth electron beam delivers a fourth amount of energy different from the third amount of energy, and the fourth target material is separate from the third target material;
wherein the portion of the third target material and the portion of the fourth target material are deposited substantially simultaneously over the substrate to form a second layer over the substrate.

8. The vapor deposition method of claim 7, wherein the second layer comprises a columnar microstructure.

9. The vapor deposition method of claim 8, wherein the second layer is deposited over the first layer.

10. The vapor deposition method of claim 8, wherein the first layer is deposited over the second layer.

11. The vapor deposition method of claim 8, wherein the first target material is the same as the third target material, and the second target material is the same as the fourth target material.

12. The vapor deposition method of claim 1,
further comprising applying a third electron beam to vaporize a portion of a third target material, wherein the third electron beam delivers a third amount of energy, and
wherein the portion of the third target material is deposited, substantially simultaneously with the portion of the first target material and the second target material, over the substrate to form the layer.

13. The vapor deposition method of claim 12, wherein the third target material comprises alumina.

14. The vapor deposition method of claim 13, wherein the layer comprises a substantially homogeneous composition.

15. The vapor deposition method of claim 1, wherein the layer comprises at least 50 weight percent rare earth silicate, formed by combination of at least some of the rare earth oxide and at least some of the silica.

16. The vapor deposition method of claim 15, wherein the layer comprises a first layer formed over the substrate and a second layer formed over the first layer, the first layer comprising a rare earth disilicate, the second layer comprising a rare earth monosilicate, and wherein an interface between the first layer and the second layer is distinct.

17. The vapor deposition method of claim 15, wherein the layer comprises a first layer formed over the substrate and a second layer formed over the first layer, the first layer comprising a rare earth disilicate, the second layer comprising a rare earth monosilicate, and wherein an interface between the first layer and the second layer is a compositionally graded transition that is predominately rare earth disilicate adjacent the first layer and predominately rare earth monosilicate adjacent the second layer.

* * * * *